(12) United States Patent
Roustaei

(10) Patent No.: US 6,347,163 B2
(45) Date of Patent: *Feb. 12, 2002

(54) SYSTEM FOR READING TWO-DIMENSIONAL IMAGES USING AMBIENT AND/OR PROJECTED LIGHT

(75) Inventor: Alexander R. Roustaei, La Jolla, CA (US)

(73) Assignee: Symbol Technologies, Inc., Holtsville, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/444,387

(22) Filed: May 19, 1995

Related U.S. Application Data

(63) Continuation-in-part of application No. 08/329,257, filed on Oct. 26, 1994.

(51) Int. Cl.[7] .................................................. G06K 9/00
(52) U.S. Cl. .............. 382/324; 235/462.21; 235/462.42
(58) Field of Search ................................. 235/470, 472, 235/454, 456, 462.01, 462.08, 462.09, 462.1, 462.11, 462.2, 462.21, 462.41, 462.42; 382/312, 313, 317, 321, 324

(56) References Cited

U.S. PATENT DOCUMENTS

| | | | |
|---|---|---|---|
| 3,819,938 A | 6/1974 | Kornrumpf et al. | 250/222 |
| 3,876,900 A | 4/1975 | Amatsuka et al. | 313/510 |
| 4,115,703 A | 9/1978 | Dobras | 250/568 |
| 4,306,147 A | 12/1981 | Fukuyama et al. | 250/221 |
| 4,542,528 A | 9/1985 | Sanner et al. | 382/62 |
| 4,570,057 A | 2/1986 | Chadima, Jr. et al. | 235/472 |
| 4,578,571 A | 3/1986 | Williams | 235/472 |
| 4,647,766 A | 3/1987 | Dimur et al. | 250/227 |
| 4,758,717 A | 7/1988 | Shepard et al. | 235/472 |
| 4,804,949 A | 2/1989 | Faulkerson | 340/710 |
| 4,818,847 A | 4/1989 | Hara et al. | 235/455 |
| 4,841,132 A | 6/1989 | Kajitani et al. | 235/472 |
| 4,850,009 A | 7/1989 | Zook et al. | 379/96 |

(List continued on next page.)

OTHER PUBLICATIONS

"CCD Bar Code Scanner;" ZB–1000/2000 Plus Series, Zebex Industries, Inc., 1992 Zebex Catalog No. 920802 (specifications).
"CCD Bar Code Handy Scanner Model BHS–6000 Series;" Nippondenso Co., LTD., Mar. 1992 brochure (specifications).
"Get a Head with Denso's Reading Edge Technology;" ID Systems, Apr. 1987, vol. 7, No. 3 (specifications).
"Information Encoding with Two–Dimenisonal Bar Codes," Theo Pavlidis, et al., *Computer*, vol. 25, No. 6, Jun., 1992, pp. 18–28.

Primary Examiner—Andrew W. Johns
(74) Attorney, Agent, or Firm—Clifford Chance Rogers & Wells

(57) ABSTRACT

A system for reading a two-dimensional image, and for comparing the two-dimensional image to stored data representative of a known image. The optical scanning device comprises a sensor for capturing the two-dimensional image, which sensor includes a light source for projecting an emitted light towards the two-dimensional image and an optical assembly for focussing light, which may be ambient and or emitted light from the light source, reflected from the framed two-dimensional image onto a CMOS or CCD detector for detecting the focussed light, the detector including a photodiode array for sensing the focussed light and generating a signal therefrom. Aiming of the sensor to read the two-dimensional image is facilitated by a frame locator consisting of a laser diode which emits a beam that is modified by optics, including diffractive optics, to divide the beam into beamlets which having a spacing therebetween that expands to match the dimensions of the field of view of the sensor, forming points of light at the target to define the edges of the field of view.

20 Claims, 10 Drawing Sheets

U.S. PATENT DOCUMENTS

| | | | |
|---|---|---|---|
| 4,900,907 A | | 2/1990 | Matusima et al. ........... 235/472 |
| 5,010,241 A | * | 4/1991 | Butterworth ................. 235/472 |
| 5,073,954 A | | 12/1991 | Van Tyne et al. ............. 382/18 |
| 5,107,100 A | | 4/1992 | Shepard et al. ............. 235/472 |
| 5,130,520 A | | 7/1992 | Shepard et al. ............. 235/472 |
| 5,135,160 A | | 8/1992 | Tasaki ........................ 235/462 |
| 5,187,356 A | | 2/1993 | Chadima, Jr. et al. ...... 235/472 |
| 5,196,684 A | | 3/1993 | Lum et al. .................. 235/462 |
| 5,291,009 A | | 3/1994 | Roustaei ..................... 235/472 |
| 5,331,143 A | * | 7/1994 | Marom et al. .............. 235/472 |
| 5,349,172 A | | 9/1994 | Roustaei ..................... 235/472 |
| 5,354,977 A | * | 10/1994 | Roustaei ..................... 234/472 |
| 5,371,347 A | * | 12/1994 | Plesko ........................ 235/470 |
| 5,479,000 A | * | 12/1995 | Dvorkis et al. ............. 235/472 |
| 5,521,366 A | * | 5/1996 | Wang et al. ................. 235/472 |
| 5,525,788 A | * | 6/1996 | Bridgelall et al. ........... 235/470 |

\* cited by examiner

SYSTEM FOR READING TWO-DIMENSIONAL IMAGES USING AMBIENT AND/OR PROJECTED LIGHT

This is a Continuation-in-Part of co-pending application Ser. No. 08/329,257, filed Oct. 26, 1994.

BACKGROUND OF THE INVENTION

1. Field of the Invention

The present invention relates to a system and method for reading two-dimensional images. More particularly, the present invention relates to a system and method for reading a two-dimensional images, such as fingerprints, signatures, and photographs, using an optical scanning head and a data compression algorithm.

2. Description of Related Art

Two-dimensional images are capable of carrying valuable information for use in various applications. For example, two-dimensional images may provide personal identification (e.g., by a fingerprint) or a record of, for example, a person's medical history. Therefore, two-dimensional images are extremely valuable for carrying and conveying information and data.

Recently, optical scanners and readers have been developed that can capture and decode two-dimensional images. Such optical devices scan or obtain a video "picture" of the two-dimensional image and process it using data compression techniques to obtain decoded data representative of the image. This data can then be used in comparing the two-dimensional image to some known data generated from a known image to determine whether the decoded data and known data match. The known data can be encoded in a two-dimensional barcode symbology representative of the known image.

Manipulation of data derived from two-dimensional images is useful in a number of applications. For example, when a person opens a bank account, the bank can scan the person's fingerprint and decode that scanned image into data representative of the person's fingerprint ("stored data"), which is kept on file by the bank and by other institutions. Moreover, the stored data can be encoded onto a card that provides access to automatic teller machines (ATMs). When the person wants to gain access to money stored in an ATM, the person is asked to insert his or her ATM card into the ATM and place his or her fingertip in contact with a sensor-containing glass in which the contrast is controlled electronically in front of an optical scanner located at the ATM. The optical scanner scans and decodes the person's fingerprint to obtain features (data) representative of the fingerprint ("new data"). This new data can then be compared to the stored data kept on file with the bank or obtained from the ATM card. If the new data matches the stored data, the person is given access to the ATM; if not, access is denied. The stored data can be encoded onto the ATM card by scanning the person's fingertip and decoding the scanned information into a two-dimensional barcode symbology that represents the person's fingerprint.

Conventional optical scanners for use with two-dimensional images are very expensive, however, due to the high cost of the components necessary to build such scanners. In conventional optical scanners for two-dimensional images, the most expensive component is the image sensor, which comprises a charge coupled device (CCD). Accordingly, using CCDs for two-dimensional image sensing renders this technology not cost-effective for applications where, for example, a large number of scanners are needed by a user with a relatively small business.

Therefore, a need exists for a system and method for scanning and decoding two-dimensional images that permits the use of both a CCD sensor and sensor that is less expensive than a CCD sensor, that can perform data compression to process the image after scanning, and that can generate a barcode symbology representation of the processed image.

SUMMARY OF THE INVENTION

Accordingly, the present invention is directed to a system and method for scanning and decoding a two-dimensional image using an inexpensive optical scanning head that substantially obviates one or more of the problems due to limitations and disadvantages of the related art.

Additional features and advantages of the invention will be set forth in the description that follows, and in part will be apparent from the description, or may be learned by practice of the invention. The objectives and other advantages of the invention will be realized and attained by the system and method particularly pointed out in the written description and claims hereof, as well as the appended drawings.

In an exemplary embodiment, the optical scanning device comprises a sensor for capturing the two-dimensional image and an LED array for projecting an emitted light towards the target, i.e., the two-dimensional image, all of which are mounted on a printed circuit board (PCB). The LEDs may be used for two purposes: first, to set the optimum distance of the target to the lens system, and, second, to illuminate the target during image acquisition. The LEDs used for these two functions may be the same sets or different sets of LEDs within the array. The LED array includes a plurality of LEDs, with each LED being oriented to emit light at a non-zero angle with respect to a center line running perpendicular to the front of the PCB. The LED orientation is selected to cause the light to diverge as it exits the front of the device, creating a wider beam at the target than at the front of the exit window of the device. One method by which this may be achieved is by orienting each LED at an angle different from any of the other LEDs. Another method is to orient the LEDs on either side of the centerline at complementary non-zero angles, i.e., the beam from each LED will cross the centerline at some point on its way out of the device. The sensor may also include optics disposed forward of the LED array for focussing and/or diffusing the emitted light at the target. Optics are also provided for receiving and focussing the light reflected from the target. The sensor further includes an image detector, either a CMOS (complementary metal-oxide-silicon) detector or a CCD detector, for detecting at least a portion of the light reflected from the two-dimensional image. An illumination detector comprising a photodiode or phototransistor may be included for sensing the reflected light from the target to establish exposure time to be used during image acquisition, and to determine if supplemental light is needed. A processor receives the output of the image detector for processing the sensed two-dimensional image to obtain an electrical image signal and the output of the illumination detector to control exposure and supplemental illumination, if needed. The processor, which may be a microprocessor or microcomputer, may incorporate software capability for automatic gain control, automatic exposure control, automatic black level control and automatic calibration, as well as control of the light sources and detectors. For handling large quantities of data as will be required in certain applications, the software for controlling the optical scanning device may further include a compressor function for compressing the electrical image data, the compressor employing a compression algorithm to obtain compressed image data. The software of the optical scanning device finally comprises a decoder for decoding the image signal to obtain image data representative of the two-dimensional image.

In many applications, ambient light may be sufficient for illuminating the target to permit the detector to generate a high quality image signal, however, in low light conditions, the same detector may need a light source to supplement the ambient light. To determine whether supplemental light is needed, the photodiode or phototransistor can be located close to the detector to determine how much light is actually impinging upon the detector. The output of this photodetector is amplified and converted to a digital signal, then fed to the scanning device's controller to control the amount of supplemental illumination provided by the LED light sources.

In a first embodiment, the present invention is a system and method for capturing a new two-dimensional image which may be compared to stored data representative of a known two-dimensional image. The system comprises the optical scanning device described above for capturing a new two-dimensional image. The comparison operation is provided by a second processor to determine if the new image data matches the stored data.

In still another aspect, the present invention is a system and method for generating a two-dimensional image from a scanned target which may then be compared to stored data representative of a known two-dimensional image. The system comprises a sensor as previously described for capturing the new two-dimensional image, however, the emitted light can either be used to illuminate the target image or it can be focused to form a frame identifying the field of view of the sensor. A cylindrical lens system disposed forward of the LED array focusses the emitted light into a line of light. Depending upon the orientation of the cylindrical lens(es), a line may be formed to illuminate the target two-dimensional image within a field of view of said sensor so that a reflected light is reflected from the new two-dimensional image. Alternatively, a vertical orientation of the cylindrical lens(es) provides two vertical lines of light for framing the field of view to allow the user to aim the sensor at the target, and the target image is illuminated by ambient light. Either of the cylindrical lens applications can also be achieved by directing an LED (or laser diode) toward a cylindrical mirror which reflects a plane of light that can provide a line of light at the target.

In the above described systems, the optical scanner may include optics for indicating the area of the target that falls within the field of view so that the device can be correctly aimed at the target image, or so that the target image can be moved to be within the device's field of view, i.e., a "frame locator". In addition to the vertically-oriented cylindrical lenses to create frame lines using the LED light, one or more laser diodes may be provided alone or in combination with diffraction gratings, binary optics, beam splitters and/or mirrors to generate lines or points of light to indicate the location of the edges of the field of view of the detector. The frame locator may be used alone, with only ambient light providing the means for scanning the target, or, in combination with the LEDs where the entire field of view is illuminated. Where the laser provides edge markers as part of the frame indicator function, typically, there are four points of light, defining the four corners of a square or rectangular field of view.

BRIEF DESCRIPTION OF THE DRAWINGS

Understanding of the present invention will be facilitated by consideration of the following detailed description of preferred embodiments of the present invention taken in conjunction with the accompanying drawings, in which like numerals refer to like parts, and in which.

DESCRIPTION OF THE PREFERRED EMBODIMENT

Figure 1:
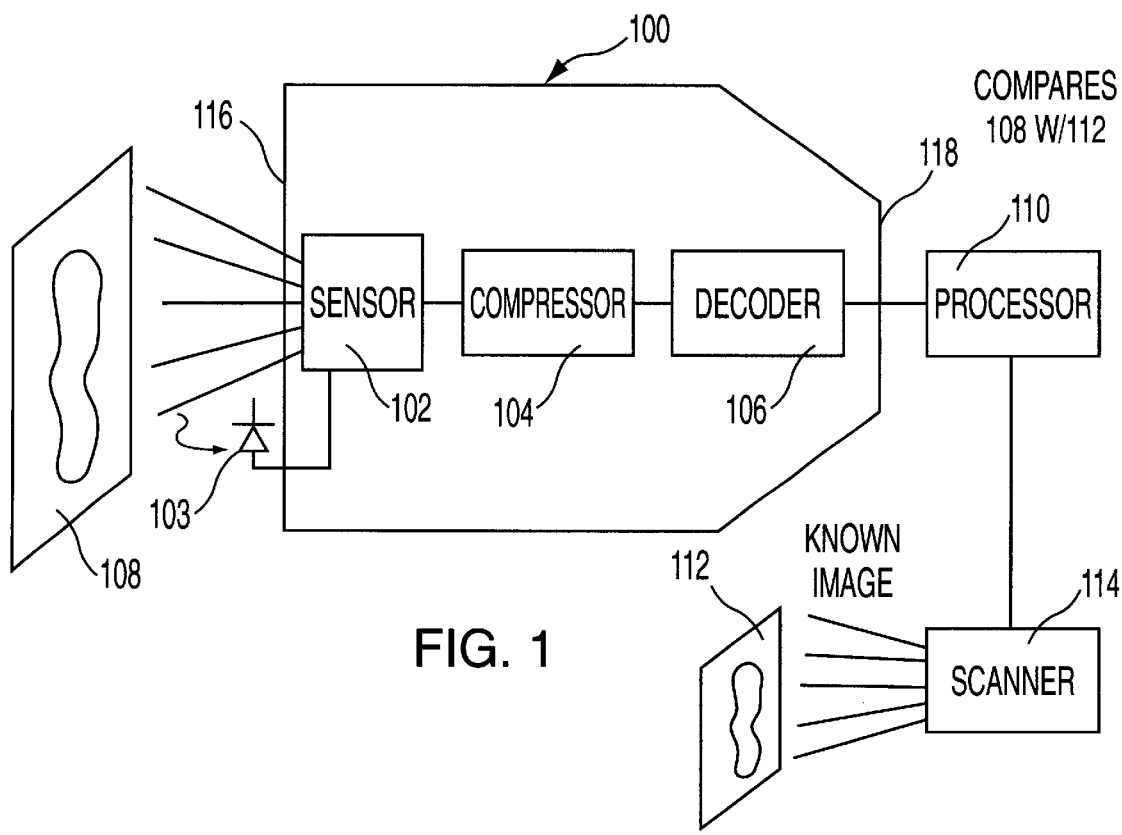
FIG. 1 is a diagrammatic representation of a system of the present invention.

An exemplary embodiment of the system and method of the present invention is illustrated in FIG. 1 and is designated generally by reference numeral 100. As embodied and shown in FIG. 1, the optical scanning device 100, which has a front 116 and a back 118, includes a sensor 102, a compressor 104, and a decoder 106, all of which are used in reading a two-dimensional image 108. The system further includes a processor 110 for processing the image and/or comparing image data representative of the two-dimensional image 108 to stored data representative of a known image 112 to determine if the image data matches the stored data. The known image 112 may be read by a scanner 114. The two-dimensional image 108 can be any one of a variety of images, including fingerprints, signatures, photographs, and one- or two-dimensional barcode symbols. The present invention will be described in detail below.

Figure 2:
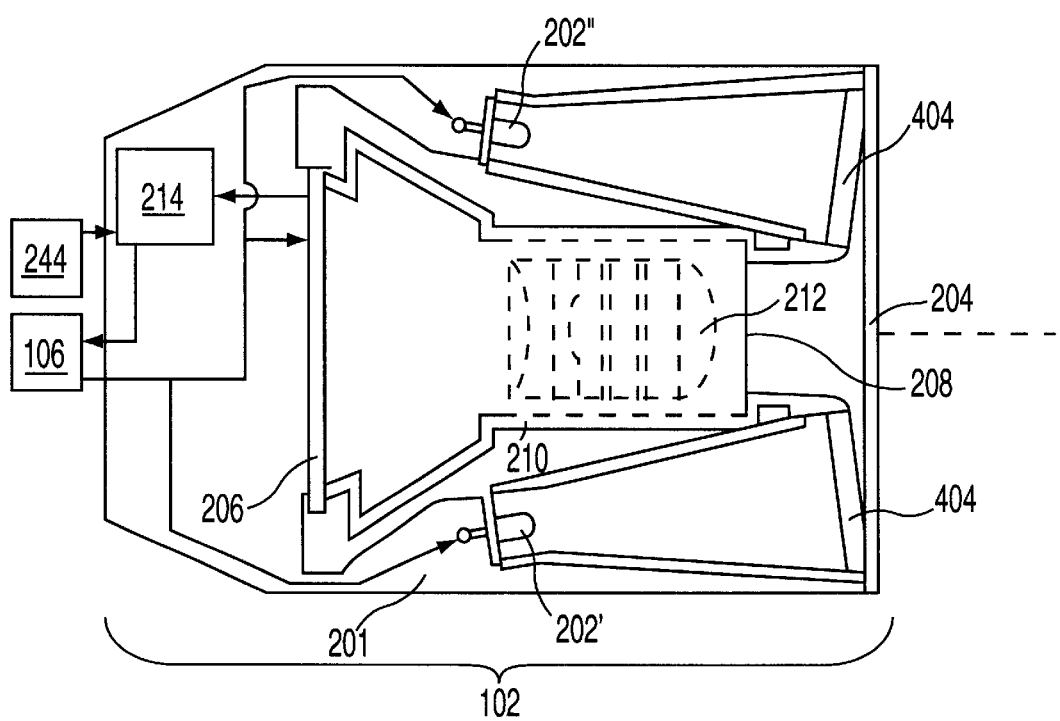
FIG. 2 is a diagrammatic view of a first embodiment of the optical scanning device of the present invention, showing the LEDs, optical module, and detector on a printed circuit board in accordance with the present invention, showing the illumination pattern.

A first embodiment of the optical scanning device 100 of the present invention, particularly the sensor 102, is illustrated in detail in FIG. 2. The sensor 102 may be formed on a printed circuit board ("PCB") 201. As illustrated in FIG. 2, the sensor 102 includes an LED array 202 (made up of LEDs 202' and 202"), a window 204, and a detector 206. The LED array 202 is used to project emitted light towards the two-dimensional image 108. While more LEDs may be used for target illumination, the preferred embodiment of the LED array 202 includes only two LEDs, with one disposed on either side of the optical path of the detector. The LEDs may be configured in a "V"-shaped, "U"-shaped, square or rectangular shaped (in a vertical plane with respect to the PCB), or linear pattern in an orientation that results in projection of a light ray by each LED at a non-zero angle with respect to a center line perpendicular to the front edge of the PCB, so that the beam increases in width at increasing distances from the front edge of the PCB. (Various configurations are illustrated and described in U.S. Pat. No. 5,354,977 of the present inventor. In each variation, the critical feature is that the beam increases in width as it progresses away from the front of the PCB so that images wider than the width of the window 204, or of the device's housing, can be read in a "snapshot".) The line of reference for describing the orientation angles of the LEDs is shown as a dashed line in FIGS. 2 and 3, perpendicular to the front 116 of the PCB. This expanding or diverging beam makes possible the detection of two-dimensional images that are wider than the window 204 itself. The details and operation of the LED array 202 are described in U.S. Pat. No. 5,354,977, which patent is herein incorporated by reference. Alternatively, mirrors, or a combination of mirrors and lens effects, may be used to create a diverging beam, as may any other method of achieving divergence of the light beam at greater distances from the window 204 or other point of exit from the PCB.

Figure 5:
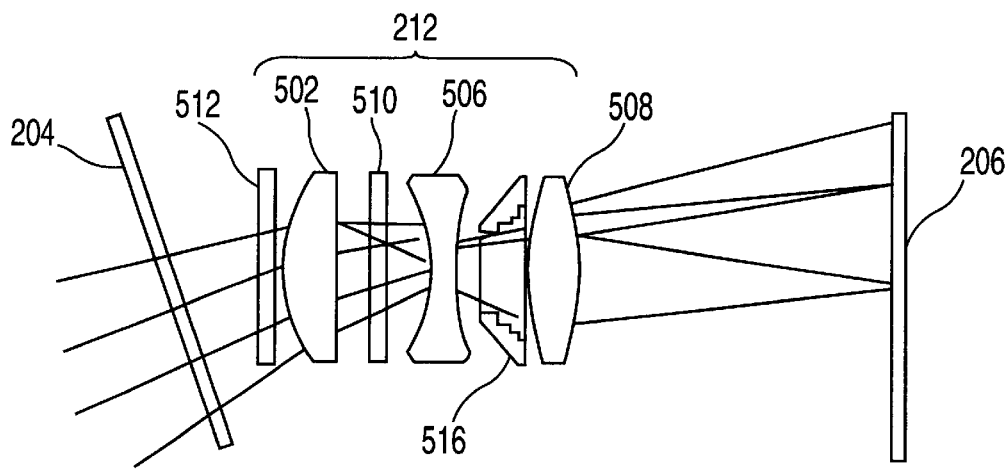
FIG. 5 is an exploded view of an exemplary embodiment of the lens assembly of the present invention and an optical system ray trace.

An optical module 208 is disposed behind the window 204. The optical module 208 has a light shield (dark room 210), in which is contained a lens assembly 212 that filters and focuses light reflected from the two-dimensional image 108 (in FIG. 3) onto the detector 206. (The lens assembly in FIG. 2 is shown with dashed lines to identify its location within the dark room, while the top portions of the dark room above the LEDs are not shown.) An exemplary lens assembly 212 is illustrated in FIG. 5, which is described in detail below. Referring again to FIG. 2, a signal generated by activation of the detector 206 by the reflected light is conveyed to a signal converter 214, which may comprise an analog filter and an analog-to-digital converter. A detailed diagram of the signal converter components is provided as FIG. 20. The signal converter 214 may be coupled to the decoder 106, which is described in detail below. The signal converter 214 may also be coupled to a D.C. power source or battery 244, which provides electrical power to the detector 206, LEDs 202' and 202", and the control hardware. The power source 244 is described in detail in U.S. Pat. No. 5,354,977, incorporated herein by reference. Forward of the LEDs, either attached to the PCB 201 or mounted within a housing containing the PCB 201, is the window 204. The window 204 is light transmissive and provides filtering, focusing and positioning of the light path of the illuminating beam incident upon the two-dimensional image 108 to be read. The reflected light carrying the intensity modulated two-dimensional image signal is directed back to the lens assembly 212 and thereby to the detector 206.

Figure 20:
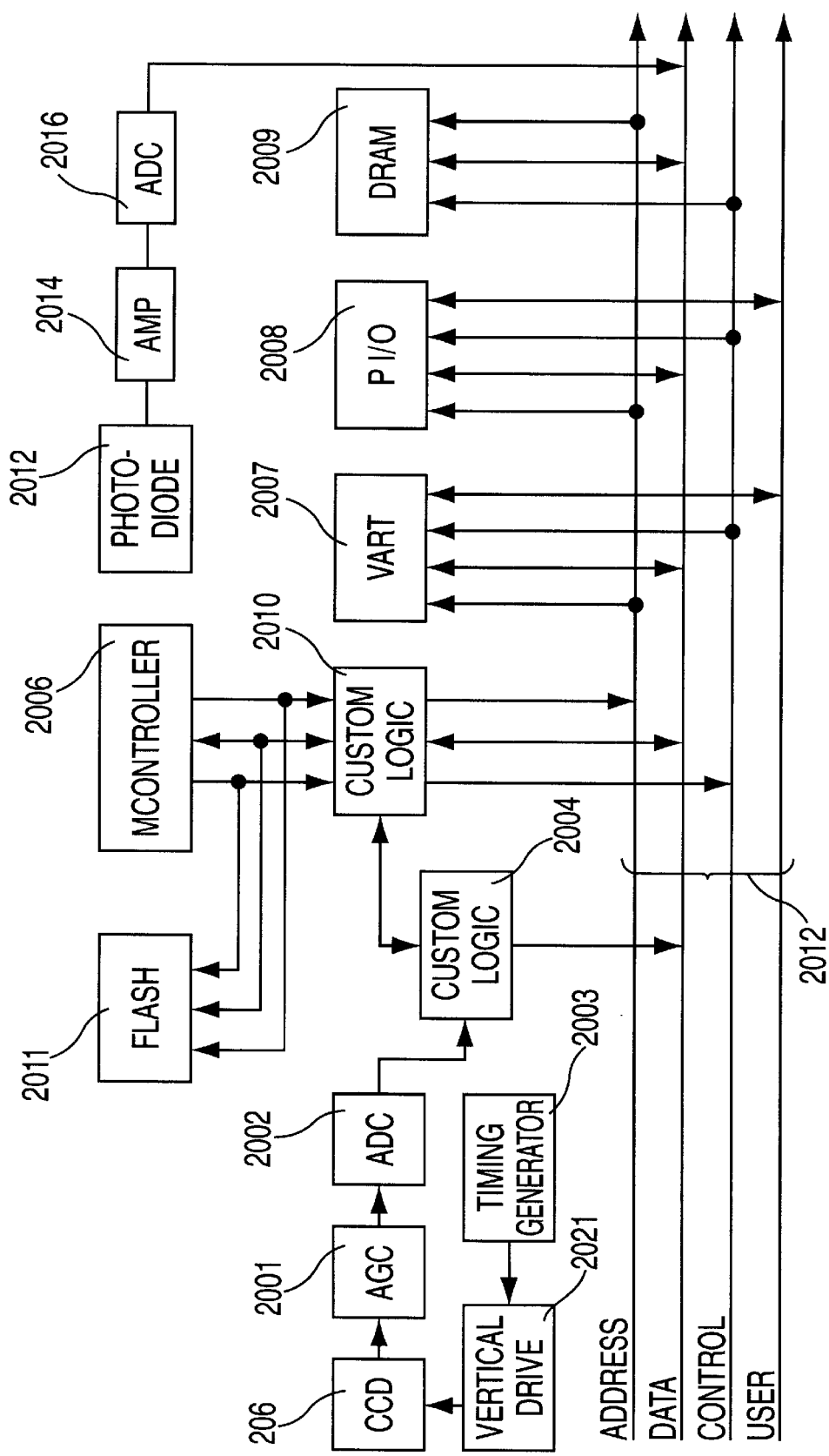
FIG. 20 is a block diagram of the signal processing hardware.

A phototransistor or photodiode 203 may be placed in the vicinity of the detector 204 to measure the amount of light reflected from the target and seen by the detector 204 to set exposure time for optimal contrast and clarity. In one embodiment, the photodiode 203 is located on top of the darkroom 210 near the detector 204 to provide the approximation of light received at the detector. This information is also used to determine if additional illumination is required by the detector 204 to provide a clear image of the target. Referring to FIG. 20, the voltage signal generated by the photodiode 203 is amplified by amplifier 2014 and converted to a digital signal by analog-to-digital converter 2016 to provide a digital representation of the illumination level near the detector. This digital signal is conveyed by the data bus to be used by the custom logic to control exposure and illumination level. If the illumination provided by the ambient light is sufficient for the image detector to generate a clear image signal, there will be no need to activate the LEDs for supplemental light. A threshold for minimum light intensity required by the image detector will be translated to a threshold voltage level from the photodetector 203, so that the controller can establish the need for supplemental illumination prior to the scan based upon the signal from the photodetector 203.

As illustrated in FIG. 20, the signal converter 214 includes hardware for carrying out various operations on the signal output by the detector 206, including automatic gain control (AGC) electronics 2001, a fast analog-digital converter (ADC) 2002, timing generator 2003, sample/hold (if not present in ADC), a FIFO (first in, first out), and the logic control for all of these components. The control logic is implemented using appropriate size field-programmable gate arrays (FPGA's). As many components as possible are implemented by FPGA as custom logic 2004, e.g., hardware UART (universal asynchronous receiver-transmitter), parallel port, and single-bit I/O's. The outputs of this grouping of devices and logic is provided to a microcomputer subsystem which includes the microcontroller 2006, flash RAM (random access memory) 2011, DRAM (dynamic random access memory) 2009 and a dynamic memory controller (DMC), I/O (consisting of UART 2007, 8-bit parallel port, 16 user/system single-bit I/O 2008), system bus interface logic, and all other necessary glue logic, collectively within custom logic 2010. The system bus 2012 consists of at least the following signals: power (+5V), ground, 32 bit data bus, 24 address lines, all CPU controls, system power signals to indicate system state, e.g., idle, normal, interrupt signals, system reset signals, and necessary miscellaneous signals. As many components as possible should be integrated into the custom logic to optimize space on the PCB.

The flash RAM 2011 is used to store (download) the application software for the system, and preferably has sufficient memory capacity to handle multiple software routines for signal encoding and decoding. (For example, data compression.) The DRAM 2009 receives digital data directly from the detector 206 (by way of the logic control 2004), permitting storage of an entire frame of essentially raw data, i.e., a "frame grabber" or snapshot, for preliminary evaluation of the system operation. The transfer of image data to the DRAM 2009 must be accomplished rapidly, on the order of less than 30 ms to permit system evaluation to occur frequently without impairing other system functions. While this transfer is being effected, the processor 2006 should be able to perform a useful task to optimize system efficiency. One way of achieving this is by employing a FIFO which is written during the DRAM refresh cycle. During operation of the DRAM (non-refresh period), the FIFO can be written to, and a DMA transfer will be requested by the control circuitry when a sufficient number of bytes of data have been written into the FIFO. During the accumulation of detector content in the FIFO, the processor 2006 will have access to the DRAM through the system bus and can perform useful work on the portion of image stores in the DRAM.

The control functions of the processor 2006 are 1) provide general utilities for software development such as programming the flash RAM, uploading the captured image to the host, downloading programs from the host, debugging, etc.; 2) provide serial/parallel communication to a location outside the system; 3) provide control for image capture; 4) provide general image processing tasks; 5) provide set-up and initialization functions; provide low battery detection function; 6) provide control for audible and visual good read indicators; and 7) run user specific code.

The hardware components of the signal processor are commercially available and selection of appropriate devices would be apparent to those skilled in the art. In an exemplary embodiment, the processor 2006 is manufactured by IDT may be one of the following part numbers: 79RV3081E-25J or 79RV3081E-25PF. DRAM 2009, of which 2 are used, is a 256×16 device made by NEC (part no. uPD42S4170 LG5-A70), Toshiba (part no. TC514170 B), or Hyundai (part no. HY514170 BSLTC-70). Each of the two flash RAMs 2011 is a 256×16 device made by AMD (part no. Am29F400. The UART circuitry 2007 is available from Exar as part no. XR-16C450CJ. ADC 2002 is specified as 8-bit, 20 MSPS, and may be obtained from Sony (part no. CXD2311R), Hitachi (part no. HA 19211), Sharp (part nos. LH50506 or LH50506N). The AGC 2001 is available from Sony as part no. CXA1690Q. Vertical driver 2021 may be obtained from Sony (part no. CXD1267N), Sharp (part no. LR36683N), Texas Instruments (part no. TMC57253). The timing generator 2003 is made by Sony as part no. CXD2400R. The FIFO has a 2K capacity and is made by Dallas as part no. DS2011R050.

The LEDs for one- and two-dimensional scanners may be selected so that they emit light at the wavelength of approximately 660 nm, red light within the visible spectrum. This wavelength provides optimal contrast for barcode scanning applications in which dark and light bars must be distinguished. (For three-dimensional bar codes, two or more distinct wavelengths of light are selected, one of which may be 660 nm.) Infrared light also provides enhanced contrast, so that LEDs emitting light outside of the visible spectrum may be used. LEDs of differing colors may also be used for separating superimposed or intermixed colors, or to optimize contrast within the image. The optimum scanning wavelength may be determined by measuring several color and black and white codes of various types using a photometer. The incoherent light produced by the LEDs may be replaced by coherent light from laser diodes, helium-neon lasers or other coherent light sources, as long as the appropriate mechanical means, such as a rotating reflective surface, are provided to spread or scan the spot to generate the light. Alternative light sources are described in U.S. Pat. No. 5,354,977.

A sample test for two-dimensional image and barcode contrast measurement involves placing the targets in uniform illumination (from a standard white light source) and measuring the photopic reflectance with the meter. The following references were measured:

TABLE 1

| Target | Reflectance (cd/m$^2$) |
|---|---|
| Standard white card | 330.0 |
| Standard black card | 14.0 |
| White bar | 300.0 |
| Black bar | 22.0 |
| Red bar | 97.0 |
| Blue bar | 114.0 |
| Green bar | 140.0 |

Another consideration in selection of LEDs is based upon the detectors 206 to be used. The selection of the operational wavelength of an LED with a particular type of a CMOS or CCD detector 206 is determined by two parameters: (1) the spectral responsivity of the CMOS or CCD detector 206 in volts/lumen (V/L) or volts/watt (V/W), and (2) the total luminous flux output F in lumens (L) of the LED. The evaluation to determine the relative figure of merit between any combination of LEDs and detectors is given by the following equation:

$$V_{out} = \int V(\lambda) F(\lambda) d(\lambda), \tag{1}$$

where $V(\lambda)$ is the detector spectral sensitivity in volts/lumen/micron, and $F(\lambda)$ is the flux output in lumens/micron of the LED. The normalized relative spectral sensitivity is given in FIGS. 4–3 of the Sony data sheet for the ILX503. The flux output F is given by the maximum luminous intensity $I_v$ (lumens/steradian) times a constant determined by the radiation pattern of the LED. The constant is the integration of the relative luminous intensity as a function of angular displacement. This constant of integration is provided in the Hewlett-Packard data book (in FIGS. 7 and 8 thereof) and is labeled as $\phi_v(\theta)/I_v(O)$. The following LEDs were evaluated to determine the highest relative output voltage:

TABLE 2

| LED | $\lambda_{pk}$(nm) | $V(\lambda)$ | $I_v$ (l/sr) | $\phi_v(\theta)/I_v(O)$ | $V_{out}$* |
|---|---|---|---|---|---|
| HLMA-CL00 | 590 | 0.9 | 1.3 | 0.180 | .22 |
| HLMP-8104 | 650 | 0.7 | 4.0 | 0.115 | .32 |
| HLMP-8100 | 650 | 0.7 | 0.7 | 0.290 | .14 |
| HLMP-8150 | 650 | 0.7 | 15.0 | 0.016 | .17 |

*Because the CCD is optically filtered, the expression for $V_{out}$ can be approximated by a delta function.) For the purposes of the optical scanner described herein, the HLMP-8104 was found to be the most efficient for CCD applications, offering 1.5 times the output of the next lower LED at 650 nm. Additional factors that may be considered are cost and power consumption. Other LEDs may be used including those manufactured by Sharp as part number GL5UR3K1. Tests similar to the above can be used to identify the most efficient light source for CMOS detectors.

Figure 13A:
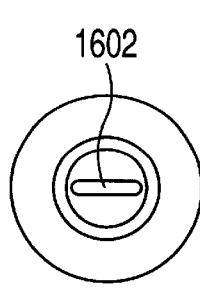
FIGS. 13A–13C are diagrammatic views of a spatial filter having slit, cross-slit, and a circular apertures, respectively.
Figure 13B:
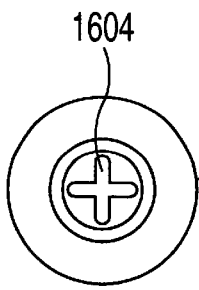
Figure 13C:
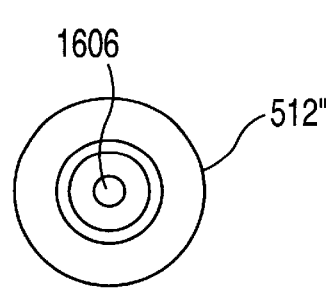

With reference to FIG. 5, a spatial filter or aperture 512 may be included within the optical module 208, disposed adjacent to or even integral with the lens assembly 212. FIGS. 13A–13C illustrate various embodiments of the spatial filter 512. As shown in FIG. 13A, the spatial filter 512 may be an air slit 1602 with an orientation and configuration corresponding to the shape of the image or barcode being scanned, or can be a circular aperture 512" as illustrated in FIG. 13C. For a one-dimensional barcode, the single slit 1602, as illustrated in FIG. 13A, is used. The slit 1602 is oriented vertically so that it is perpendicular to the direction in which the barcode is scanned. For two-dimensional barcodes and other images, the spatial filter 512' may have a crossed slit pattern 1604, as shown in FIG. 13B. The horizontal and vertical slits of the crossed slit pattern 1604 may each have the same dimensions as the single slit 1602, or the dimensions of the vertical and horizontal slits may differ from each other. Alternately for the two-dimensional and for a three-dimensional dimensional scanner, a single circular aperture 1606 for the spatial filter 512" may be used.

Referring now to FIG. 5, the light absorber/diffuser 516 is in the form of a cone or funnel, i.e., decreasing diameter, having an aperture with its wider end facing towards the detector end of the lens assembly 212. The funnel absorbs extraneous scattered and diffracted light which is not part of the signal.

The bandpass filter 510 serves to block any radiation which falls outside of a wavelength range centered around the wavelength emitted by the light source, e.g., 660 nm for red LEDs, in the IR range for infrared light sources. For a visible light system, it is particularly desirable to filter the infrared and other visible portions of the light spectrum that may reach the window 204 from the sensing region to provide optimal contrast. This improves resolution of images read at a distances other than the best focus object distance of 5.5 inches. In the embodiment using LED light sources emitting at 660 nm, the filter specifications call for a center wavelength of 655 nm±6 nm, half bandwidth points (HBWP) of 50 nm±5 nm, average transmittance (HBWP) >70%, leakage of less than 2% below 600 nm and above 700 nm, and coverage to 1 mm from all edges. The filter substrate material can include BK7, fused silica, quartz or Corning 7059.

When the only light source used is the LEDs, the window 204 comprises a bandpass filter centered at approximately 660 nm (for the visible light scanner) and a light homogenizer/diffuser. The window 204 may be combined with, or separate from, a cylindrical lens 404, which focuses the light along one axis to form a plane of light, with a line of light being created at its focal point. When an image is scanned, at the precise focal point of the cylindrical lens 404, the maximum possible light will be reflected to the detector 206. The function of the window 204 is to suppress radiation noise from the LEDs, to form a homogeneous incident beam for illumination of the two-dimensional image 108, to collimate the beam, and to filter the reflected light by removing extraneous light which falls outside of the predetermined acceptable bandwidth range of 660 nm. Where ambient light is used, either alone or in combination with LED illumination, a window transmissive of all visible wavelengths, or no window at all, is used.

Figure 4A:
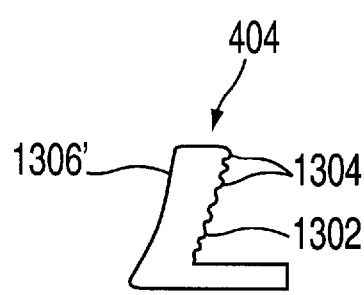
FIGS. 4A–4C are diagrammatic views of a cylindrical lens with a concave, convex, double radius output edge, respectively

The cylindrical lens 404 may be modified to provide a uniform distribution of light at the focal point without requiring any diffusion by the window 204. This "homogenization" is provided by knurling or scalloping the input side 1302 of the cylindrical lens 404, as shown in FIGS. 4A and B. Each step 1304 in the knurled edge 1302 acts as a "mini-lens" that spreads the light entering the cylindrical lens 404 at that point. The spread light from each mini-lens overlaps other spread light to homogenize the light at the focal point of the cylindrical lens 404. The focal point of the cylindrical lens 404 is determined by the outer edge 1306.

Figure 4B:
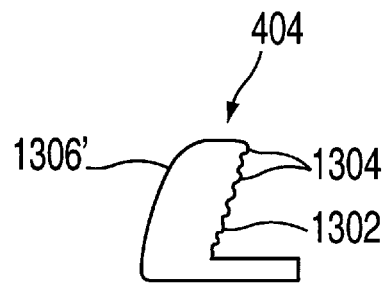
Figure 4C:
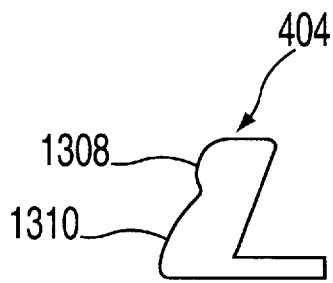
Figure 4D:
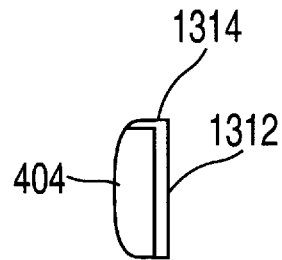
FIG. 4D is a cylindrical lens with a holographic input edge.

Alternatively, and in the preferred embodiment, the input side 1312 of cylindrical lens 404 has a film 1314 with a holographic pattern formed on its surface, as shown in FIG. 4D. This holographic pattern diffuses the light upon entry into the lens, so the light is homogenized, as above, before being focussed.

In conjunction with the knurled input side 1304 or holographic film 1314, the output edge 1306 of the cylindrical lens 404 can be either concave or convex. The concave edge 1306 is shown in FIG. 4A, and the convex edge 1306' is shown in FIG. 4B. The concave edge 1306 is selected for scans of two-dimensional images at distances from contact to 3 inches. The convex edge 1306' is used for scan distances greater than 3 inches.

Another modification of the cylindrical lens 404 is illustrated in FIG. 4C. Here, the cylindrical lens 404 has a double radius, which creates, in effect, two separate cylindrical sub-lenses 1308, 1310, each with a different focal length. The light emitted by the LEDs will be focussed by both sub-lenses 1308 and 1310 so that two different lines of focussed light are created at different angles from the lens. This lens provides greater variability in the distance at which a image can be accurately read without requiring a change in the cylindrical lens 404 or compromise in the strength of the signal.

Figure 3:
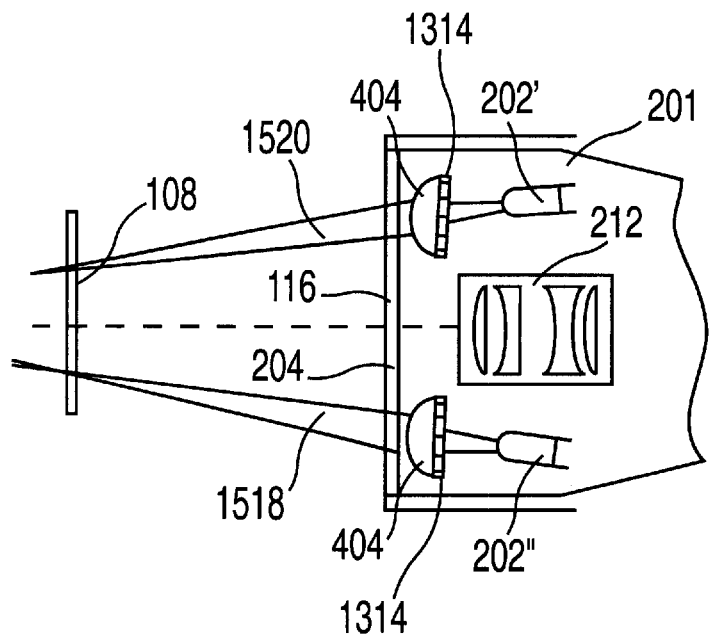
FIG. 3 illustrates the light distribution for a pair of LEDs.
Figure 15:
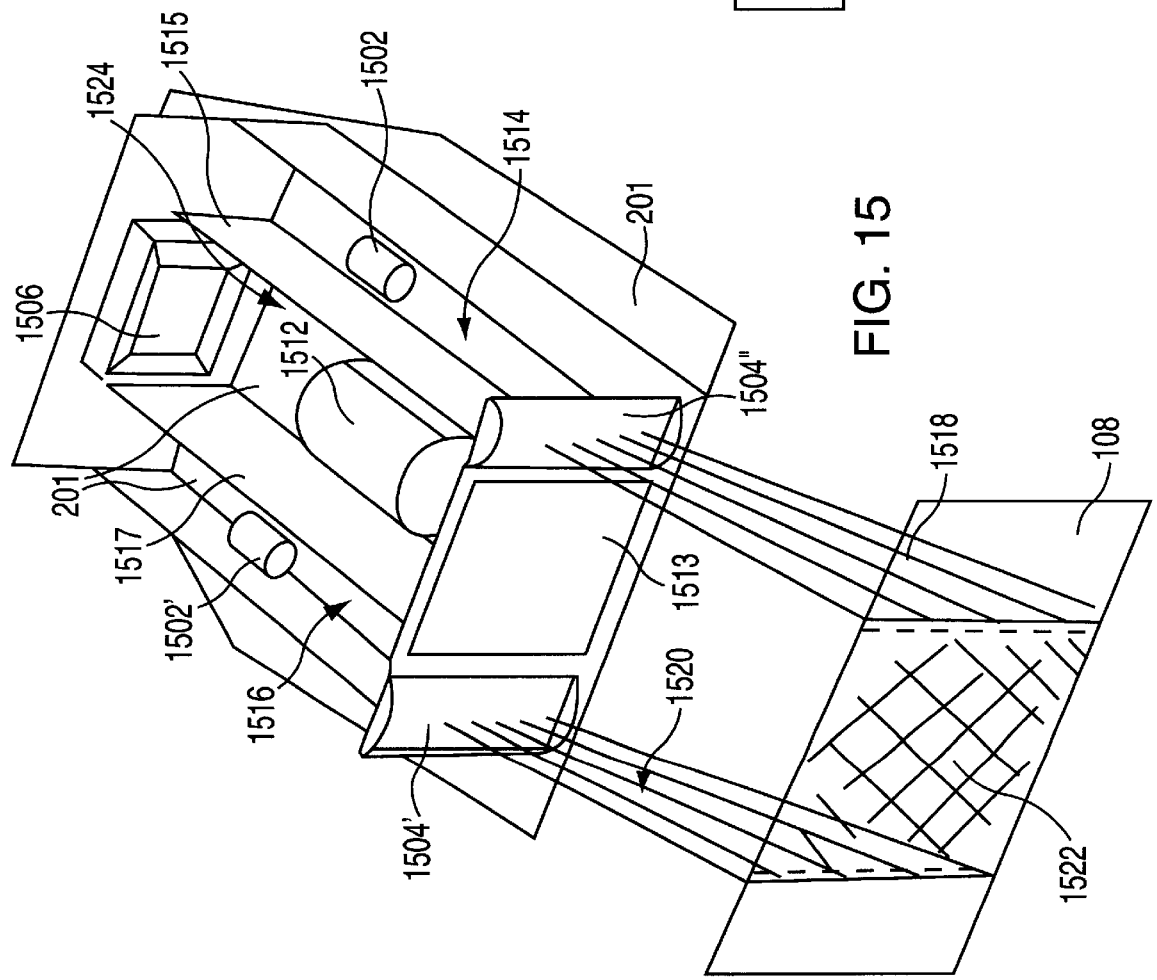
FIG. 15 is a diagrammatic view of a second embodiment of the optical scanning device of the present invention, showing the LEDs used for framing the image to be read, the cylindrical lenses, the optical module, and the detector.

As illustrated in FIG. 3, there are two cylindrical lenses 404, one disposed in front of each LED, 202' and 202". In this embodiment, the cylindrical lenses are oriented vertically with respect to the PCB 201. (FIG. 15 provides a good perspective view of this.) The result is the formation of two vertical lines of light at the focal points of the cylindrical lenses which are then used to frame the image at target 108 to be scanned. The LEDs in this case are not the primary light source for illuminating the target. Instead, the use of a CMOS detector permits ambient light to be used. Additional means for framing the image, i.e. "frame locators", will be described in detail below.

In order to optimize the combination of LEDs and lenses in the first embodiment, several radiometric measurements were made on the HP-8103 5 mm LED to make observations on the coupling efficiency of this LED with several off-the-shelf lenses. The LED was biased to 20 mA and the following was recorded:

TABLE 3

| Distance | | Reading in eV | |
|---|---|---|---|
| (inches) | Lens | Center | Line |
| 1.0 | no lens | 10.0 | — |
| 16.0 | no lens | 8.0 | — |
| 7.0 | 1 cylindrical | 8.5 | 5.0 |
| 1.0 | 1 cylindrical | 10.0 | 6.5 |
| 6.0 | 1 collection/cylindrical | 6.2 | 6.0 |

The conversion from eV to luminance is given in Table 4 for the Minolta photometer. The units are candel/$m^2$ which is equivalent to lumens/sr-$m^2$. From these measurements, it would be reasonable to assume a luminance of 10.0 cd/$m^2$ for distances of 7" or less.

TABLE 4

| eV | cd/$m^2$ |
|---|---|
| 1 | 0.28 |
| 2 | 0.56 |
| 3 | 1.10 |
| 4 | 2.20 |
| 5 | 4.5 |
| 6 | 9.0 |
| 7 | 18.0 |
| 8 | 36.0 |

TABLE 4-continued

| eV | cd/m² |
|---|---|
| 9 | 72.0 |
| 10 | 144.0 |

The objective of the optical system design is to achieve sufficient resolution at the object distance within the depth of field. These parameters may be obtained with a number of different lens combinations ranging from three to five or more lenses. After computer simulation of ray traces, a combination of four lenses was selected to provide the desired performance. In the preferred embodiment, the overall optical system specification calls for an object distance of 175 mm, a nominal magnification of 0.32, a nominal f/number of 26.0, effective focal length of 36.52 mm, total field of 26.5 degrees, track length of 19.49 mm, and overall length of 46.89 mm. The MTF at best focus is >0.5 at 25 lines/mm.

Referring now to FIG. 5, a preferred embodiment of the optic module 208 is shown, having four lenses 502, 504, 506, and 508 within lens assembly 212 (see FIG. 2), all of the lenses being retained within the dark room 210. The selection of the four lenses forming the lens assembly 212 depends on the desired reference plane, i.e., the desired depth of field, which is the distance between the front window or diffuser 204 and the image 108 being read. The lens assembly 212, illustrated in the ray trace in FIG. 5, comprises a bi-convex lens 502, a piano-convex lens 504, and a bi-concave lens 506 followed by a bi-convex lens 508. The lenses 502, 504, 506, 508 may be coated with an anti-reflection coating and/or a pass band coating to minimize reflectance at the interfaces between the adjacent lenses and at the ends of the lens assembly 212.

Table 5 lists the individual specifications that were identified for each lens in the preferred embodiment.

TABLE 5

| Lens | Focal Length | Total Track |
|---|---|---|
| 32 | 14.20 mm | 3.63 ± .03 mm |
| 38 | −32.11 mm | .60 ± .03 mm |
| 36 | −12.86 mm | 1.66 ± .03 mm |
| 40 | 35.18 mm | 1.41 ± .03 mm |

All lenses are made from BSC7 with a refractive index of 1.514 at 660 nm, have an aperture stop diameter of 1±1 mm with a tolerance of ±0.05 mm and have a single layer anti-reflective coating at 660 nm. The values will vary if a different wavelength of light or different combinations of lenses and/or material are to be used, and the above specifications are provided as an example of one way of achieving the desired optical performance. Selection of appropriate lens combinations is within the level of skill in the art so long as the guidelines provided herein are followed. The following descriptions of the plots provided in the drawings are intended to emphasize the numerous considerations in selecting the appropriate optical system.

FIGS. 6 through 11 provide plots that assist in the selection of appropriate lens combinations. FIG. 6A, a plot of field curvature/distortion, illustrates the position away from the plane of the detector of best focus for all field angles expressed as distance in millimeters. For example, for a field angle of ±13° off-axis, the position of best focus is 2.00 mm behind the detector 206. For all other angles, the plane of best focus corresponds very closely to the detector 206 location.

Figure 6A:
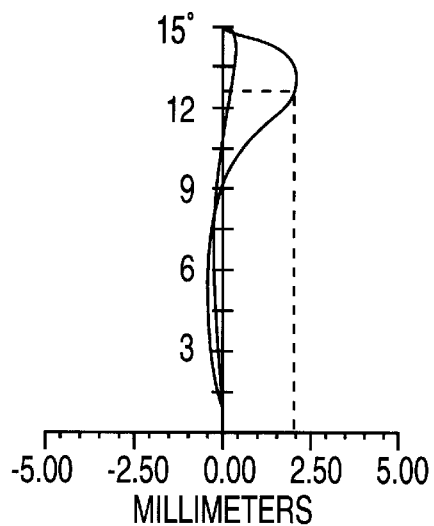
FIG. 6A is a plot of a field curvature with field angle.
Figure 6B:
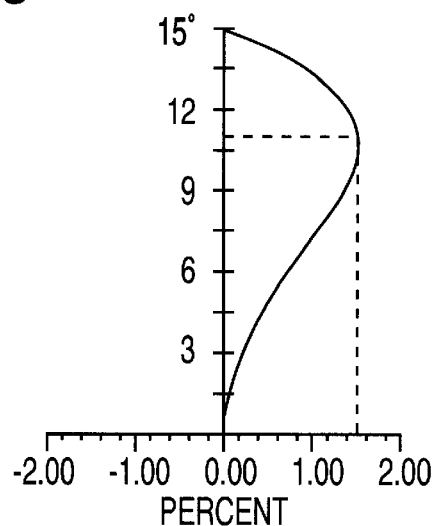
FIG. 6B is a plot of percentage distortion with field angle.

FIG. 6B plots percentage compression or expansion with field angle and provides the amount of compression or expansion of a bar width at the image plane in comparison with the true bar width expressed as a percentage. For example, if the true bar width on-axis is 6 mils wide, then at 11° off-axis, the bar width is 1.5% greater than 6 mil.

Figure 7:
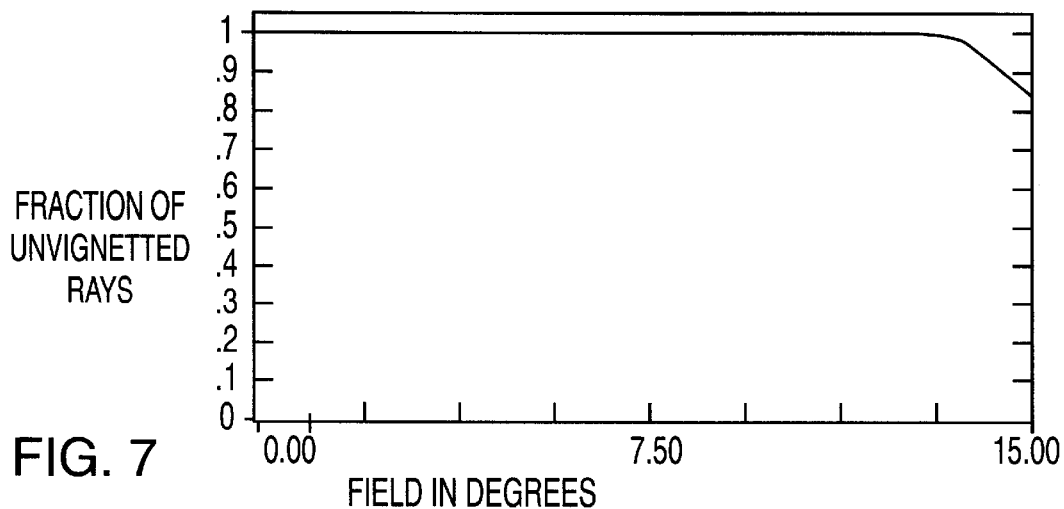
FIG. 7 is a plot of illumination uniformity as a function of field angle at the detector of the present invention.

Illumination uniformity as a function of field angle is charted in FIG. 7. The field angle values given in the plot are positive or negative angles with respect to "on-axis", so that the total field of view would be twice that value plotted, e.g., for 15°, the total field of view is 30°. The loss of illumination at increased field angle is due to aperture blockage or lens constraints.

Figure 8:
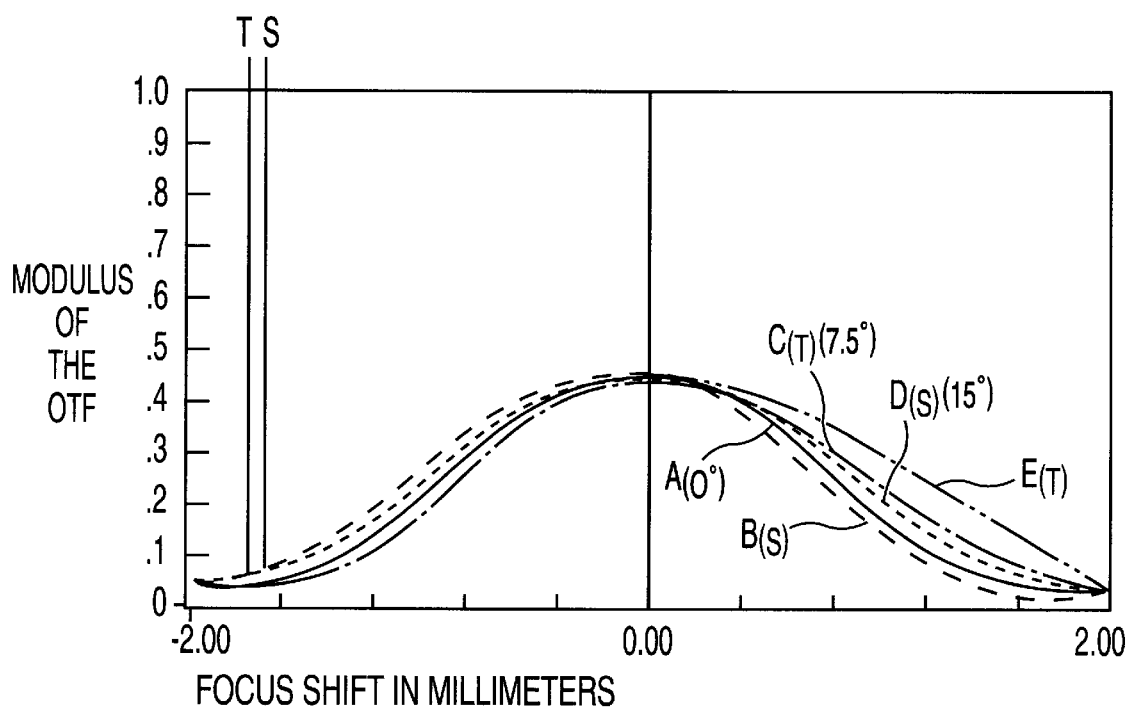
FIG. 8 is a plot showing contrast reduction with depth of focus for various field angles.

FIG. 8 is a plot of the diffraction through focus modulation transfer function (MTF). Five separate lines are drawn to indicate variation with field angle. Curve A shows the contrast reduction as the object is held at best focus while the image plane is moved in and out of focus for a field angle of 0°. (The x-axis of the plot is focus shift in millimeters.) For example, for a 30 line/mm resolution image target, the contrast goes to zero when the image plane is moved in or out by more than 2.00 mm. Curves B and C are for a field angle of ±7.5° off-axis. Curve B is for sagittal rays and curve C is for tangential rays. Tangential rays only are images for the one-dimensional scanner, while two-dimensional scanner images use tangential and sagittal rays. Curves D and E are similar to curves B and C, respectively, but are for a field angle of ±15° off-axis.

Figure 9:
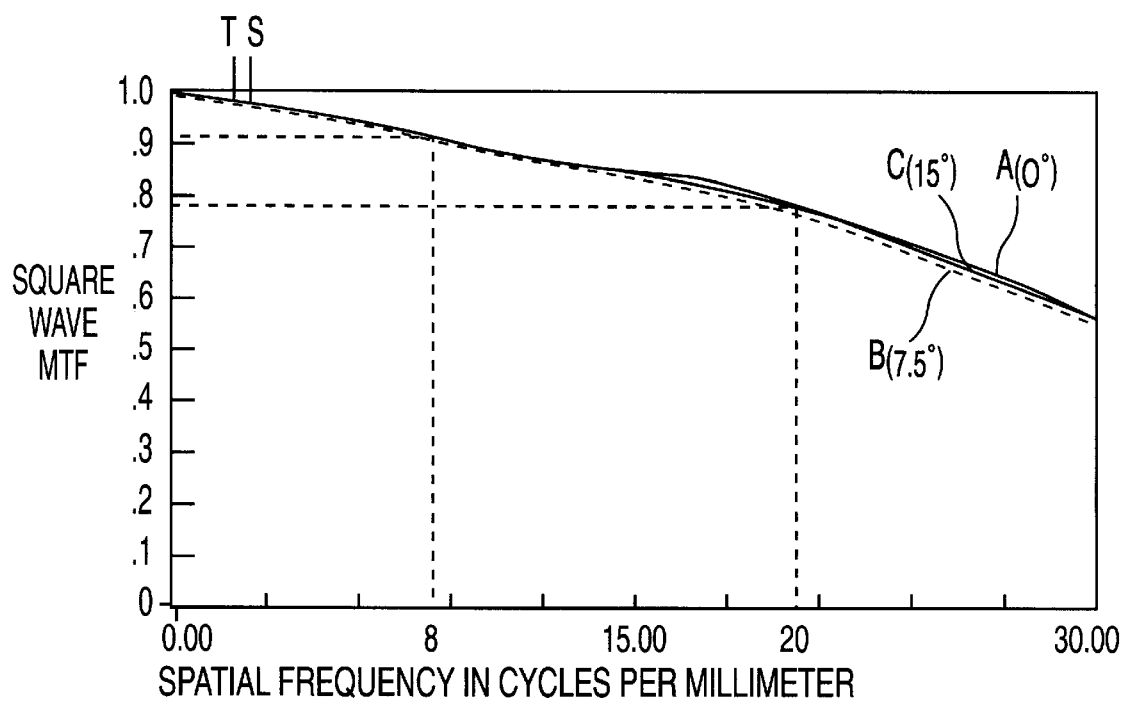
FIG. 9 is a plot showing contrast for all spatial frequencies at a distance of 5.5" from the optical scanning head of the present invention.

FIG. 9 is a plot of diffraction square wave MTF with spatial frequency of the symbols (bar codes, etc.) to be read. Curve A provides the contrast of the optical system for all spatial frequencies at a distance of 5.5" for objects on-axis (0°). The plot is the same for tangential and sagittal rays for the on-axis case only for rotationally symmetric systems. Curve B is for a field angle of ±7.5° and curve C is for a field angle of ±15°.

Figure 10:
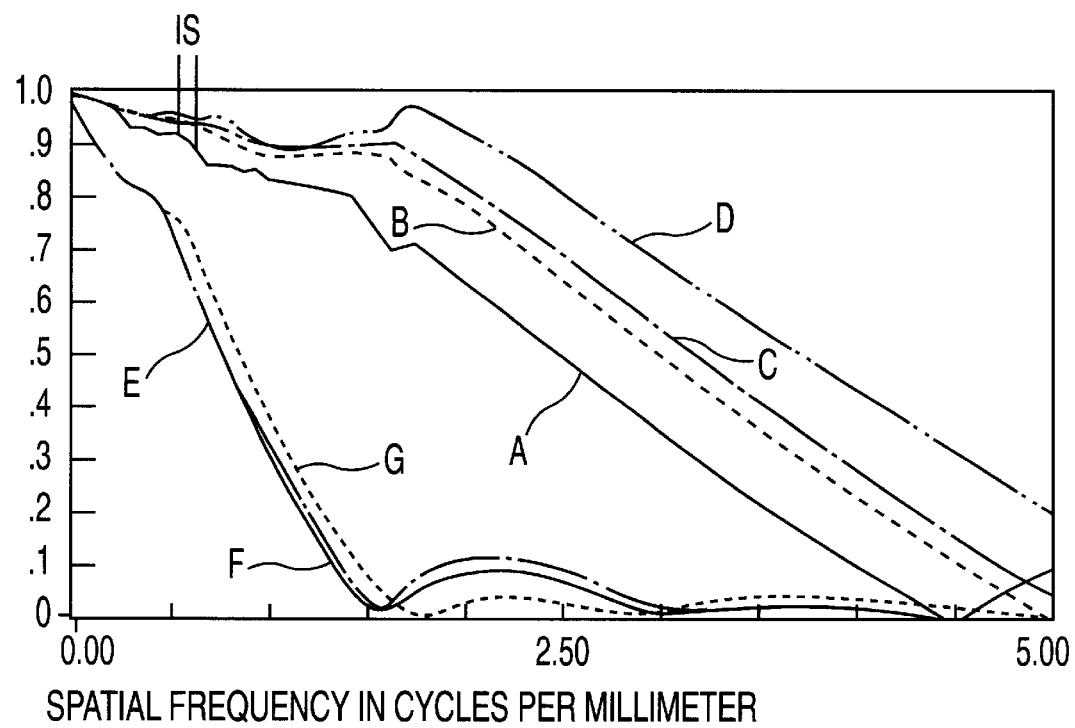
FIG. 10 is a plot showing resolution at various field angles at a given distance from the optical scanning head of the present invention.

FIG. 10 is a plot of diffraction square wave MTF with spatial frequency of the image being read. Curve A is resolution with the scanner 20" from the symbol, on-axis (0°). Curves B, C and D are for on-axis, ±7.5° and ±15°, respectively at a distance of 16 inches from the image. Curves E, F and G are for on-axis (0°), ±7.5° and ±15°, respectively at a distance of 0.5" from the image being read.

Figure 11:
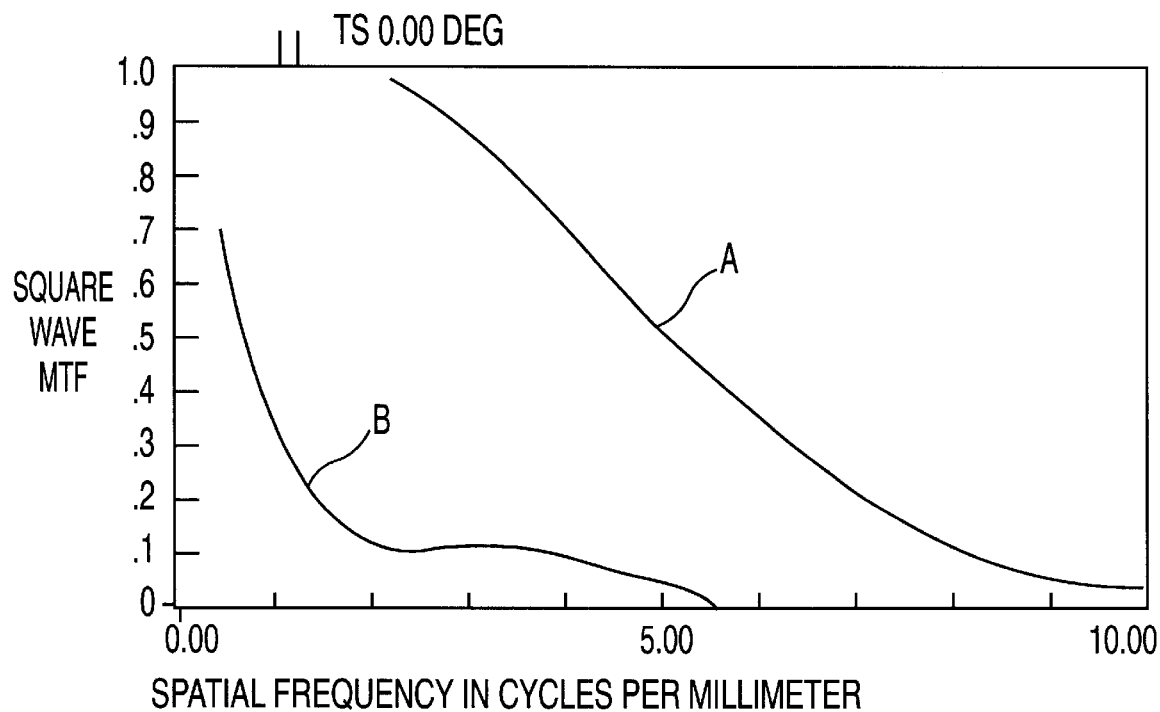
FIG. 11 is a plot of resolution at given distances from the optical scanning head of the present invention.

FIG. 11 is a plot of resolution on-axis at 8.5" and 2", respectively, from the image.

A first embodiment of the detector 206 of the present invention is described in U.S. Pat. No. 5,354,977, incorporated herein by reference. That first embodiment comprises a CCD detector having an array of charge coupled devices (CCDs) arranged in equally spaced pixels. The CCD detector may include additional processing elements, as described in the above patent. The arrangement of the CCD array depends on the application, for example, two-dimensional scanning versus one-dimensional scanning. Such CCD detectors are well-known in the art.

Selection of a CCD array depends on a variety of parameters. First, to obtain optimum performance, a calibration of the dark levels and shading correction must be made. Second, a shading correction frame, or flat field, is required to make correction for variations in system responsivity. These parameters are both described in U.S. Pat. No. 5,354,977.

The third parameter influencing selection of the CCD array is the signal-to-noise ratio of a given device. In one embodiment, a Sony ILX505 was evaluated. The system parameters using the ILX505 are:

CCD sensitivity S: 21 V/lx–s at 3200K light source;
CCD relative spectral response: 1.0 at 475 nm, 0.65 at 650 nm;
Read out rate t: 36 frames/sec or integration time of 27.7 msec;
Dark voltage: 0.3 mV;
LED area $A_{LED}$: $2 \times 10^{-5}$ m$^2$;
LED intensity I: 4000 mcd at 650 nm;
LED solid angle illumination w: 8.0 deg or 0.015 steradians;
Diffuser transmittance $T_D$: 0.9
Diffuser area $A_D$: $1.5 \times 10^{-4}$ m$^2$;
Bar code reflectance $R_B$: 0.50;
Total Optical System Transmission (at 650 nm) $T_O$=0.70;
Optical system f/number: 22.0.

The applicable conversions are:
The CCD sensitivity at 650 nm is 21 V/lx-s x 0.65=13.65 V/lm/m$^2$/s; the total intensity I of the LEDs is 8.0 lumens/sr for two LEDs only.

The total brightness onto the diffuser is:

$$B = (I\omega/\pi A_{LED}) \quad (3)$$
$$= (8.0)(.015)/\pi(2 \times 10^{-5})$$
$$= 1,905 \text{ lumens/m}^2\text{-sr.}$$

The total lumination onto the bar code is given by:

$$L = T_D B A_D / R^2, \quad (4)$$
$$= (.9)(1905)(1.5 \times 10^{-4})/(.177)^2$$
$$= 8.21 \text{ lumens/m}^2\text{-sr,}$$

where R is the distance from the diffuser to the bar code. The luminance L, therefore, is about 8.2 lumens/m$^2$-sr at a distance of 7 inches away.

When the optical system images the bar code onto the CCD, the final luminance is given by:

$$E_{CCD} = \frac{\pi L T_o}{4(f/no.)^2(1+m)^2}, \quad (5)$$

where m is the system magnification. The illumination at the CCD is about 6.0E-3 lumens/m$^2$ for a magnification of 0.3.

The CCD converts the illumination into a voltage signal given by the following equation:

$$V_{out}=E_{CCD} S t, \quad (6)$$

where S is the sensitivity and t is the integration time. The result above indicates a signal of about 2.0 mV and, therefore, a SNR of 6.67 for a readout rate of 36 frames (scans) per second.

The inventive scanner is not limited to the CCD array for which specifications are provided above. Other arrays may be selected depending upon intended use, data transfer rate, and desired detector area, among other factors that will be apparent to one skilled in the art. The following CCD arrays are among those that may be used: Sony part no. 1CX024BL-6 ($A_D$=121 $\mu$m$^2$); Sharp part no. LZ2364J ($A_D$= 40.95 $\mu$m$^2$); Texas Instruments part no. TC237 ($A_D$=54.76 $\mu$m$^2$); Kodak part no. KAI-0310 ($A_D$=81 $\mu$m$^2$).

The end-to-end simulation of an imaging CCD array reading a high spatial resolution target can be simulated by treating the individual system components as a Fourier transform operator on the input optical signal. The four main components are the input image or barcode, the optical lens, the readout decoder electronics, and the CCD array. Because operations occur in the spatial domain, the overall system transfer function is the product of the individual components. The function is expressed mathematically as:

$$O(f)=I(f)L(f)R(f)CCD(f), \quad (7)$$

where O(f) is the output signal in spatial domain for a degraded target; I(f) is the input target spatial frequency dependent on the smallest image; L(f) is the lens spatial resolution or MTF; R(f) is the readout electronics or transfer MTF; and CCD(f) is the CCD spatial frequency or CCD MTF.

From the geometry of the CCD array, $$MTF=\sin c(f\pi x/f_{max}p) \quad (8)$$

where:
p=cell periodicity
x=cell dimension in the x-direction
$f_{max}$=1/p when p=x.

From detection theory, the output signal in spatial frequency must have a value of 0.1 for useful discrimination, i.e., O(f)=0.1. Therefore, if I(f)=0.55 (the contrast of the dark to light bars at 0.660 $\mu$m), R(f)=0.95 and CCD(f)=0.95 then L(f) must be >0.20 for all positions of the image object position.

The above includes all system components that can degrade the resolution of a perfect image or barcode. A term is added to include the magnification effect that occurs for a finite object as its distance to the first lens surface is varied. The limiting discernable image element or bar size is equal to its object size times the optical system magnification. For example, for a 0.006 inch (0.150 mm) object element or bar and a system magnification of 0.5, the image element or bar size is 0.075 mm. This is the same as 26.66 l/mm. Therefore, the lens must have the response L(26.66)=0.2, which can be expressed mathematically as:

$$L(2/obj \times mag)>0.2 \quad (9)$$

where obj is the x-dimension of the smallest image element or bar to be read; and "mag" is the magnification for the optical system.

The image of a point formed on an x,y plane can be calculated as a modulation transfer function in spatial frequency. If P(x,y) is, by definition, the point spread function, that is the distribution of points of ray intercepts at the image plane, then the line spread function is the integral of the point spread function in one direction. Therefore, $$L(x)=\int P(x,y)dy. \quad (10)$$

The modulation transfer function (MTF) which determines the spatial resolution in one direction is given by:

$$MTF(f)=[A_c^2(f)+A_s^2(f)]^{1/2} \quad (11)$$

where, $$A_c(f) = \frac{\int L(x)\cos(2\pi fx)dx}{\int L(x)dx} \quad (12)$$

$$A_s(f) = \frac{\int L(x)\sin(2\pi fx)dx}{\int L(x)dx}. \quad (13)$$

If the origin of the x,y coordinates is placed at the centroid of P(x,y), then the function $A_s(f) \rightarrow 0$. The expression for MTF can be approximated by:

$$A_c(f) = 1 - 2\pi^2 f^2 \left[ \frac{\int L(x)x^2 dx}{\int L(x)dx} \right] \quad (14)$$

or $A_c(f)=1-2\pi^2 f^2 B_x^2$, where $B_x^2$ is the rms blur of L(x). The relation between the point spread function P(x,y) and the rms blur of the image point is given by:

$$B = (B_x^2 + B_y^2)^{1/2}. \quad (15)$$

The range over which an imaging reader can function is dependent upon four variables, which are: 1) input spatial frequency of the image being read, 2) resolution of the optical lens, 3) resolution of the CCD array, and 4) contrast of the image being read. With the assumption that high quality images will be read, the contrast can be considered to be 1.0 over all spatial frequencies. (For poor quality images, the contrast can drop to a value of 0.5 over all spatial frequencies.) The CCD array with an 11 micron pixel pitch and spacing has an MTF of approximately 1.0 over the spatial frequencies that correspond to commonly used barcodes and images. (For a CCD array with an 8 micron pitch and spacing, the MTF would be slightly higher but almost the same, because images are being read with a spatial frequency of less than 20 line pairs per millimeter.) The two variables left as a function of each other are the image spatial frequency at the image plane and the degraded resolution of the lens as a function of object position. Because objects are being imaged over finite extents, the magnification (or reduction) at the image plane must be computed over the expected object distances.

The magnification of a lens system having a focal length of f=35 mm and with a nominal 30 degree total field of view used with a 28.5 mm CCD array was computed from exact ray tracing over a range of object distances corresponding to 0.5 inches to approximately 20 inches from the front surface of the scanner. The magnification is selected so that, for a given distance, the complete area of the CCD array is filled up with the image. This efficient use of the detector allows the maximum possible depth of field. These magnifications are listed in Table 6. The resulting spatial frequency in lines per millimeter is given by:

$$F_s = 1/(\text{magnification})(\text{bar width}). \quad (16)$$

This, in effect, determines the minimum spatial resolution that must be decoded. For example, for a 13 mil (0.013") barcode at a distance of 4 inches from the scanner head, the optical resolution must be greater than 1/(0.38)(0.33 mm), or, 8 line pairs/mm. See FIG. 9 which shows that at 8 line pairs/mm, the contrast for a square wave (barcode) input of 0.91 meets the criteria of having a contrast greater than zero.

The resolution of the optical system for any object distance is determined from a square wave modulation transfer function calculation. This is the Fourier transform of the image spot size for a square wave input (i.e., bar target or bar code), which yields the spatial frequency of the spot size in lines/mm. This degraded resolution (for an object not at best focus) must be greater than the minimum required resolution. For example, a maximum resolution in excess of 20 lines/mm for an object distance of 4 inches is shown in FIG. 9. This would mean that all images and barcodes are capable of being decoded at this object distance, since the highest minimum resolution required is 17.5 lines/mm (for a 6 mil barcode). Table 6 shows that the maximum number of the highest resolution necessary to decode an image or barcode of 6 mil or lower density should be 17.5 line pairs at 4 inches. FIG. 9 is the imaging diffraction square wave MTF at 5.5 inches from the scanning head, which shows the spatial resolution for all frequencies (or bar densities) at 4 inches for a 20 line pair/mm code is 0.78, which is greater than zero and can thus be decoded at 4 inches. As another example, at 2 inches away, the maximum resolution is zero at approximately 5.5 lines/mm. Point B on Table 6 shows all barcodes can be decoded except the 6 mil barcode because it has a minimum necessary resolution of 11.3 line pairs/mm, whereas all other barcodes have a minimum necessary resolution less than 5.5.

TABLE 6

| Distance (inches) | mag. | minimum resolution required (lines/mm) | | | | |
|---|---|---|---|---|---|---|
| | | 6 mil | 13 mil | 30 mil | 44 mil | 72 mil |
| 0.5 | 2.1 | 3.1 | 1.4 | 0.6 | 0.5 | 0.3 |
| 1.0 | 1.1 | 6.0 | 2.7 | 1.2 | 1.0 | 0.5 |
| 1.8(B) | .59 | 11.5 | 5.1 | 2.2 | 1.9 | 0.9 |
| 2.4 | .51 | 13.1 | 5.9 | 2.6 | 2.2 | 1.1 |
| 3.4 | .42 | 15.9 | 7.2 | 3.1 | 2.7 | 1.3 |
| 4.0(A) | .38 | 17.5 | 8.0 | 3.4 | 2.9 | 1.4 |
| 4.4 | .36 | 18.5 | 8.4 | 3.6 | 3.1 | 1.5 |
| 5.4 (nominal) | .31 | 21.5 | 9.8 | 4.2 | 3.6 | 1.8 |
| 6.4 | .28 | 23.8 | 10.8 | 4.7 | 4.0 | 2.0 |
| 7.4 | .25 | 26.7 | 12.1 | 5.3 | 4.5 | 2.2 |
| 8.4 | .23 | 29.0 | 13.2 | 5.7 | 4.8 | 2.4 |
| 9.4 | .21 | 31.7 | 14.4 | 6.3 | 5.3 | 2.6 |
| 10.4 | .19 | 35.0 | 15.9 | 6.9 | 5.9 | 2.8 |
| 11.4 | .18 | 37.0 | 16.8 | 7.3 | 6.2 | 3.0 |
| 12.4 | .17 | 39.2 | 17.8 | 7.7 | 6.6 | 3.2 |
| 13.4 | .16 | 41.7 | 18.9 | 8.2 | 7.0 | 3.4 |
| 14.4 | .15 | 44.4 | 20.2 | 8.8 | 7.5 | 3.6 |
| 15.4 | .14 | 47.6 | 21.6 | 9.4 | 8.0 | 3.9 |
| 16.4 | .13 | 51.3 | 23.3 | 10.1 | 8.6 | 4.4 |
| 17.4 | .125 | 53.3 | 24.2 | 10.5 | 8.9 | 4.6 |
| 18.4 | .12 | 55.5 | 25.2 | 11.0 | 9.3 | 4.6 |
| 19.4 | .115 | 58.0 | 26.4 | 11.4 | 9.7 | 4.8 |

By utilizing the information provided in Table 6 and in FIGS. 6–11, it is possible to determine the criteria for acceptable resolution of any given barcode or image at distances of up to 20 inches and field angles up to ±15° (total field of 30°), thus allowing the scanner to be set up with fixed focus optics which do not require adjustment for different scans. This wide field of view also allows barcodes and images to be read at a range of pitch and skew angles without requiring perfect alignment of the scanner with the surface on which the image or barcode is affixed.

A second embodiment of the detector 206 which provides the advantage of more economic construction comprises a CMOS detector, as is well-known in the art. For example, a CMOS detector is disclosed in an article by Oliver Vellacott, IEEE REVIEW, May 1994, at 111. The CMOS detector disclosed therein includes a plurality of MOS transistors, each of which represents a pixel. The source region of each MOS transistor is exposed to form an array of photodiodes for sensing incident light and converting it into a current or electrical signal. The electrical signal gradually discharges the gate capacitance of the MOS transistor, and the pixel is then read by opening the gate, thus connecting the photodiode to the MOS transistor drain.

As embodied herein, the CMOS detector 206 comprises a CMOS-VLSI unit for detecting and storing images and having an array of 312 by 287 or more pixels. Detectors with 512 by 512 pixels are anticipated. The pixel size is 19.6 by 16.0 microns, and the detector has exact 1:1 pixel correspondence between the physical silicon photodiodes and the pixel byte in storage. The unit has automatic exposure, with an exposure range of 40,000:1, a maximum exposure time of 20 milliseconds, and a minimum exposure time of 500 nanoseconds. The detector unit is omnidirectional, with 25% absolute dark/light reflectance minimum measured at 660 nanometers. At 18 inches from the optical scanning device 100, the size of the scan pattern is 8.5 inches by 8.5 inches. A minimum scan size is ¼" by ¼". The CMOS unit has 128K of flash random access memory (RAM), with an additional 128K of flash RAM optional, as well as 128K of volatile "image storage" RAM, with an additional 64K of volatile RAM available. Framing of the scanning pattern to facilitate detection of the scan frame is accomplished via holographic diffusers generating two parallel lines indicating the field of view and the central x-axis of the detector 206.

The CMOS detector 206 may be equipped with automatic calibration functions, including automatic exposure control (AEC), automatic gain control (AGC), and automatic black level calibration. Those functions are described in detail in U.S. Pat. No. 5,354,977, incorporated herein by reference. For AEC, the CMOS detector 206 automatically controls its exposure over a range of 40,000:1. This is the main mechanism for adjusting sensitivity to track varying picture conditions. Control is achieved by varying the integration time prior to reading each row of pixels. This integration time can be as long as one field, or as short as three cycles of the pixel clock. If necessary, the exposure time can be varied (for example, in steps of 6.26%) in the appropriate direction until the correct exposure for the scene is obtained. The exposure time for each row is preferably the same, but as exposure immediately precedes readout, the onset of exposure is different for each row. Thus, as those skilled in the art will appreciate, the overall effect of short exposure times is similar to the operation of a focal-plane shutter.

The CMOS detector 206 automatically calibrates video black level for every field, using extra pixel rows that are shielded from incident light. Black level calibration can be inhibited, in which case an internal bias voltage sets a nominal black level. This bias voltage can be overridden externally on a pin on the optical scanner 100 for fine adjustment. Automatic black-level calibration is effectively and offset control on the video output amplifier.

The output gain of the CMOS detector 206 may be controlled digitally via a 7 to 8-bit binary integer, which effectively forms a divisor in the range of 1 to 127 to 256. The top three bits are available to the user of the optical scanner 100. The top bit (bit 7) is preferably pulled low. The next two bits (i.e., bits 5 and 6), when left unconnected, default to values that optimize the gain setting for normal operation of the optical scanner 100. By driving selected bits, the user may customize the default gain setting, or "gain base."

AGC operates in the region above the gain base. If AGC is at low voltage, the CMOS detector 206 automatically increases the gain of its output stage when exposure is maximum and the picture is still too dark. For example, a threshold gain level can be provided for the electrical image signal obtained from the CMOS detector 206. If the actual electrical image signal detected by the CMOS detector 206 falls below this threshold value, the electrical image signal can be amplified to increase it above the threshold value. Otherwise, gain is maintained at its calibrated base value, set by bits 5 and 6, as described immediately above. The control range for AGC is greater than ±10 dB over the minimum gain base. In the exemplary embodiment, the AGC is available from Sony as part no. CXA1690Q.

The compressor 104 of the present invention may use a conventional data compression algorithm to compress the electrical image signal generated by the detector 206. For example, one such algorithm is disclosed in Tom Hopper, "Wavelet Applications," SPIE Proceedings 2242, at 180–85 (Harold H. Szu, ed. 1994). As those skilled in the art will understand, other algorithms may be used. The compressor 104 may comprise a processing circuit having the algorithm implemented in circuitry, software, or a combination of the two.

The optical scanner 100 of the present invention also includes the decoder 106. The decoder 106 may be either inside or outside of the scanning head housing and will process the digitized signal generated in the scanning head and compressed by the compressor 104 to calculate the desired image data representative of the scanned two-dimensional image 108.

The decoder 106 is used to decode a multiple-digit representation of the two-dimensional images, such as Maxi-Code, DATA MATRIX, Code One, and Code 16K, as well as linear symbologies such as UPC, EAN, JAN, Code 39, Code 2/51, Code 2/5, Code 128, Codabar, Plessey, and other optical encoding systems. (It should be noted that, while most optical encoding techniques of this nature are generically called "barcodes", some types of printed codes exist which may not be in the form of parallel bars. For example, a concentric target-type code is in use which involves alternating concentric rings of varying widths. The code systems that incorporate non-bar-type codes are also appropriate for measurement by the optical scanning system described herein and are considered to be included in the general category of barcodes for purposes of this description.) The decoder 106 may also be used to decode the two-dimensional image 108 and convert it into image data representative of the two-dimensional image 108. The decoder 106 is further described in U.S. Pat. No. 5,354,977, incorporated herein by reference.

Figure 14:
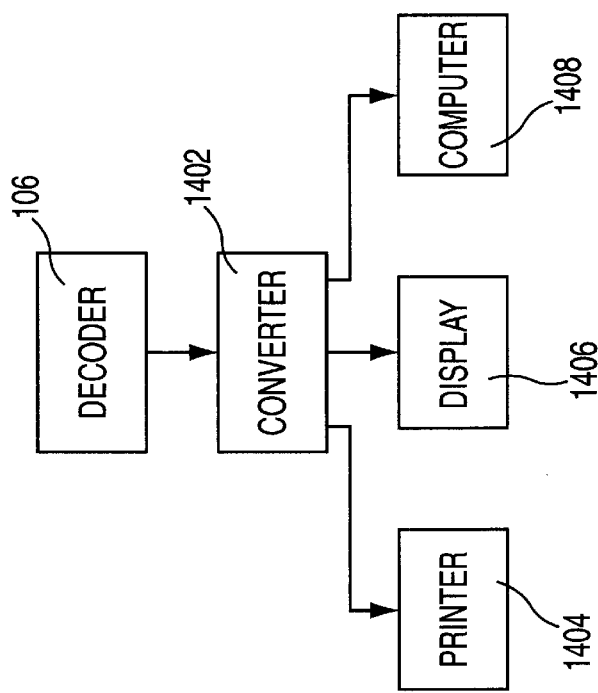
FIG. 14 is a block diagram of peripheral units that can be used in the present invention.

Once decoded, the image data can be converted into a barcode symbol or other means for communicating information. For example, referring to FIG. 14, the image data can be output from the decoder 106 and sent to a converter 1402 where it is converted into a two-dimensional barcode symbol. The barcode symbol may then be output to a variety of peripheral units, including a printer 1404, a display device 1406, or a computer 1408. If the barcode symbol is printed, it can be affixed to a box, or card, allowing the image to be conveyed in a barcode format for identification purposes and other purposes.

The embodiment of FIG. 3 is further illustrated in FIG. 15, a cut-away view of the optical scanner 102. This second embodiment includes a pair of LEDs 1502', 1502", a pair of cylindrical lenses 1504' and 1504", an optical module 1512, a CMOS detector 1506, and, optionally, a window 204. Those elements may be attached to the PCB 201. Each LED 1502', 1502" is contained in a separate enclosure 1514, 1516, respectively, within dark room 210 by barriers 1515, 1517, which isolate the light emitted from each LED 1502', 1502" from that of the other LED and from the optical assembly 1512 and the CMOS detector 1506. At the front of each enclosure 1514, 1516, disposed forward of the LEDs 1502', 1502", are the cylindrical lenses 1504', 1504". The cylindrical lenses 1504', 1504" focus the light emitted from the LEDs 1502', 1502" into vertical planes of light 1518, 1520. The two vertical light planes 1518, 1520 (each one formed by a respective LED-cylindrical lens combination) create lines of light at target 108 which are used for framing a scanning boundary 1522 of the optical scanner 102. Thus, when reading a two-dimensional image, the optical scanner 102, via the LEDs 1502', 1502" and the cylindrical lenses 1504', 1504", generates the scanning boundary 1522, which is formed by the vertical light planes 1518, 1520, and in which the two-dimensional image must lie in order to be read by the optical scanner 102. Accordingly, the vertical light beams 1518, 1520 frame the scanning area and create a means by which the optical scanner 102 can be aimed at the target two-dimensional image.

Once the two-dimensional image is brought within the scanning boundary 1522, the CMOS detector 1506' can be used to sense and process light reflected from the two-dimensional image. In this second embodiment, the LEDs 1502', 1502" and cylindrical lenses 1504', 1504" are used only to frame the scanning boundary 1522 and not to illuminate the two-dimensional image, unlike in the first embodiment of FIG. 2, where the LED array 202 is used to illuminate the two-dimensional image. Thus, in the second embodiment, only reflected ambient light is needed by the CMOS detector 1506 to detect the two-dimensional image. Such operation is distinct from the first embodiment, in which both ambient light and the light emitted by the LED array 202 is reflected off the two-dimensional image, permitting it to be read by the detector 206. Those skilled in the art, however, will recognize that this first embodiment may incorporate the LED array 202 of the first embodiment in addition to the framing LEDs 1502', 1502". In this way, the two-dimensional image would be illuminated by the LED array 202 in addition to the ambient light, which may be useful in conditions where the ambient light is minimal.

The embodiment of FIG. 15 also includes the lens assembly 1512. The lens assembly 1512 of the second embodiment is a fixed focus optical arrangement that serves to focus the ambient light reflected from the two-dimensional image and is disposed forward of the CMOS detector 1506 so that the reflected ambient light is focused onto the sensing surface of the CMOS detector 1506. Lens assembly 1512 is similar to the lens assembly 212 described in connection with the first embodiment of FIG. 5. In the second embodiment, however, the bandpass filter 510 may be omitted from the lens assembly. This is because, in the first embodiment, the illuminating LED array 202 operates at 660 nm, with the bandpass filter 510 serving to block any radiation falling outside a wavelength range centered around 660 nm. In the second embodiment, on the other hand, reflected ambient light is detected by the CMOS detector 1506, and such light is not limited a particular wavelength. Accordingly, the lens assembly 1512 need only have a selection of lenses, such as those shown in FIG. 5, although the lens assembly 1512 may include additional elements, such as the spatial filter 512 and the light absorber/diffuser 1202.

The lens assembly 1512 and CMOS detector 1506 may be isolated from the light emitted by the LEDs 1502', 150" by the barriers 1515, 1517. Thus, the emitted light from the LEDs 1502', 150" does not enter a chamber 1524 containing the lens assembly 1512 and CMOS detector 1506, preventing deleterious mixing of the ambient light reflected from the two-dimensional image with the LED emitted light. It is desirable for only the reflected ambient light to enter the chamber 1524. The window 1513 (similar to the window 204 described above) may be incorporated into the second embodiment and located forward of the lens assembly 1512. The reflected ambient light passes through the window 1513, is focussed by the lens assembly 1512, and reaches the CMOS detector 1506. Upon being sensed and processed by the CMOS detector 1506 to obtain an electrical signal representative of the two-dimensional image being read, the second embodiment of the optical scanner 102 operates like the first embodiment described in detail above.

In addition to the frame locator of the embodiment of FIG. 15, frame locators may be provided by the addition of one or more laser diodes which emit light in the visible spectrum to the optical scanning device. These laser diodes are mounted on the PCB with the other optical and electrical components, with voltage for powering the laser being provided by means similar to that for the LEDs, as is known in the art.

Figure 16:
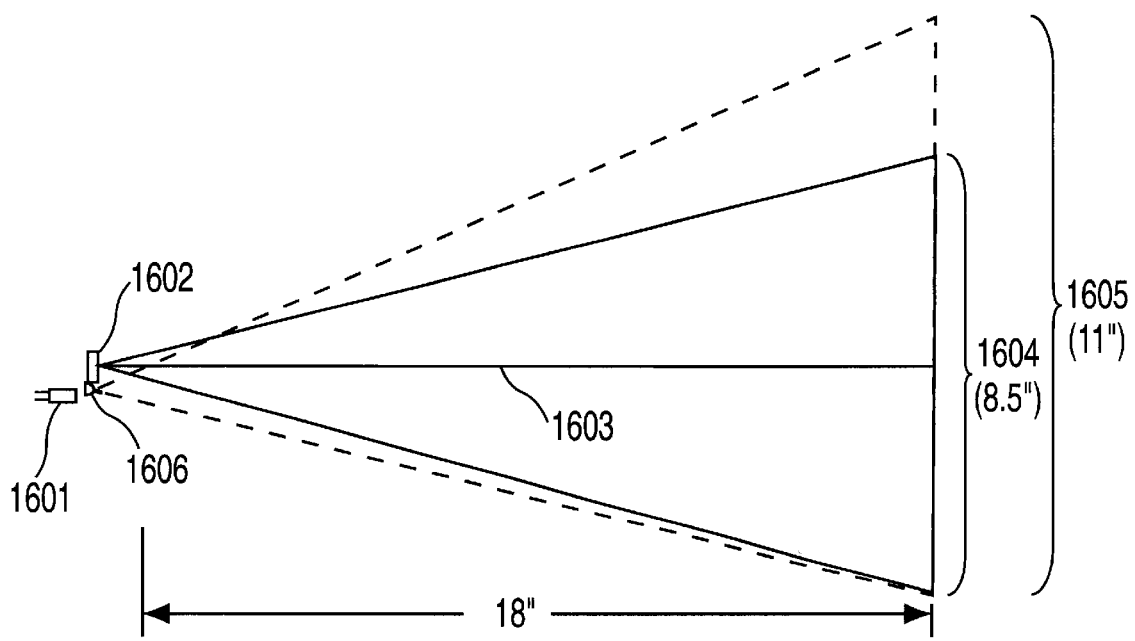
FIG. 16 is a diagrammatic view of a first embodiment of a frame locator for the present invention.
Figure 17:
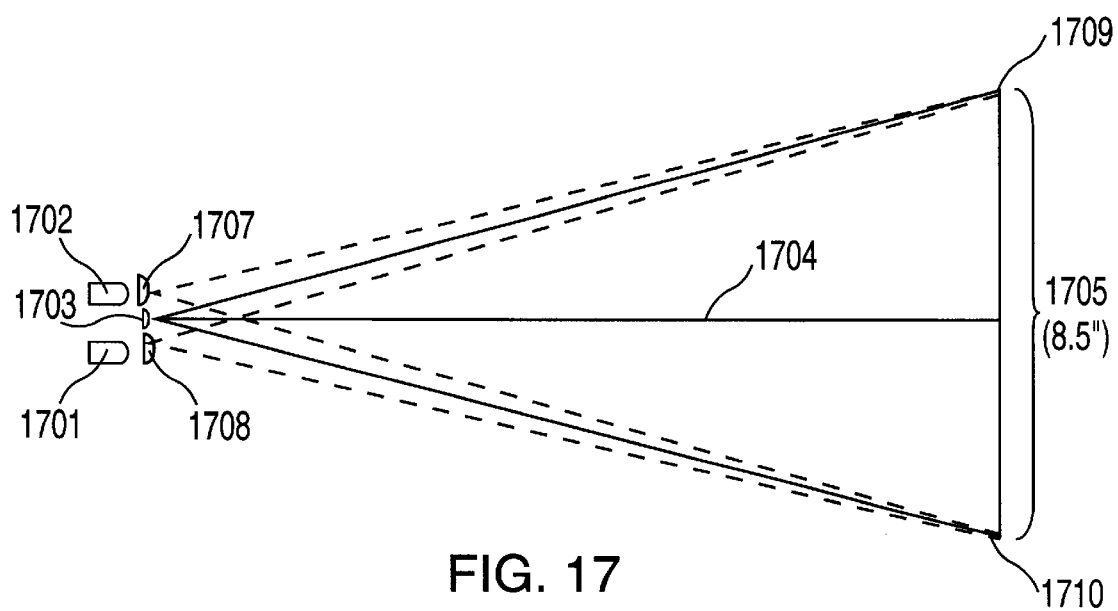
FIG. 17 is a diagrammatic view of a second embodiment of a frame locator for the present invention.

A first variation of the frame locator using a laser diode is illustrated in FIG. 16. Laser diode 1601 is placed offset from the optical axis 1603 of detector 1602. A diffractive optic 1606, either a diffraction grating (or pair of diffraction gratings) or a binary optic is located in the beam path of the laser diode 1601 to divide the beam into a plurality of beamlets, preferably four, expanding the effective beam path, i.e., the spacing between the beamlets, at substantially the same rate as the divergence of the field of view of the detector. Four beamlets are created by crossing two diffraction gratings at 90° to each other to create a two-dimensional diffraction grating. (The beamlets are indicated with dashed lines.) The expansion provided by optic 1606 causes the beamlets to define the edges of the field of view at the closest focus position of 2 inches, thus indicating the general area of the field of view to allow the scanner to be aimed correctly. For this purpose, the laser diode 1601 is offset from the detector 1602 by 0.5 in. While this variation has the advantage of using only a single laser and minimal optics, the offset from the optical axis 1603 results in the dimensions of the illumination area 1605 being larger than the area of the field of view 1604, so the indication of the frame is not completely accurate. (As illustrated, there is a 2.5 inch difference toward the upper portion of the illumination area for a field distance of 18 inches.) In FIG. 17, two laser diodes 1701 and 1702 are placed on either side of the detector 1703 so that they are centered on the detector's optical axis 1704. The beams emitted by lasers 1701 and 1702 are divided into beamlets by diffractive optics 1707 and 1708 to coincide with the field of view 1705 of the detector at the field distance of 18 inches. In this case, each of the diffractive optics is oriented in the same direction so that laser 1701 provides marks indicating the upper edge 1709 of the field of view 1705, and laser 1702 provides the marks for indicating the lower edge 1710 of the field of view 1705. However, when the field distance is shortened, the area defined by the spots of light produced by the beamlets will be larger than the detector's field of view, and the illumination is not uniform across the target area and may interfere with scanning. In order to avoid errors in the detected signal, the variation in brightness should be 2:1 or less.

Figure 18:
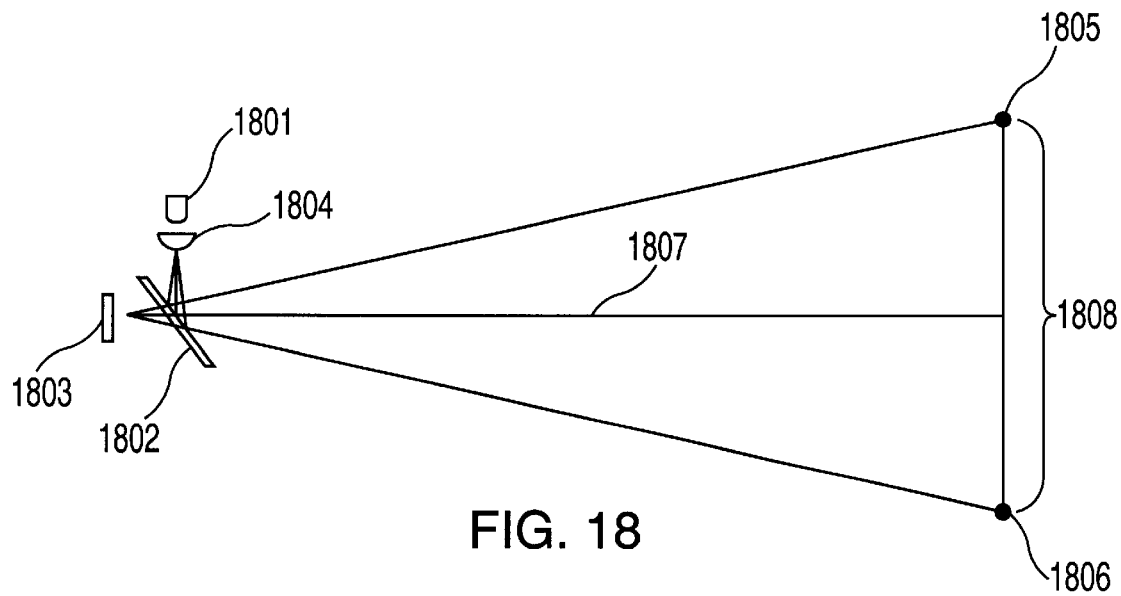
FIG. 18 is a diagrammatic view of a third embodiment of a frame locator for the present invention.

The variation of FIG. 18 provides a beam splitter 1802 to overlay the laser beam on the field of view 1808 by aligning the beam with the optical axis 1807 of detector 1803. The beam emitted by laser diode 1801 is divided and expanded by diffracting optic 1804 before being redirected by beam splitter 1802. This system allows the diverging beamlets to match the edge of the field of view of the detector 1803. An identifying mark could be placed at the edge of the detector field by including an additional diffraction grating on or near the beam splitter 1802 to form another point along the edge of the beam, e.g., at 1805 and/or 1806. A custom binary optic can be created to generate five beamlets, with the fifth beamlet providing the marker. A disadvantage of this system is that the beam splitter reflects 50% and transmits 50% of the light, so compensation should be made by selecting a sufficiently bright laser that 50% or less of the light intensity is sufficient to make the edge markers clearly visible.

Figure 19:
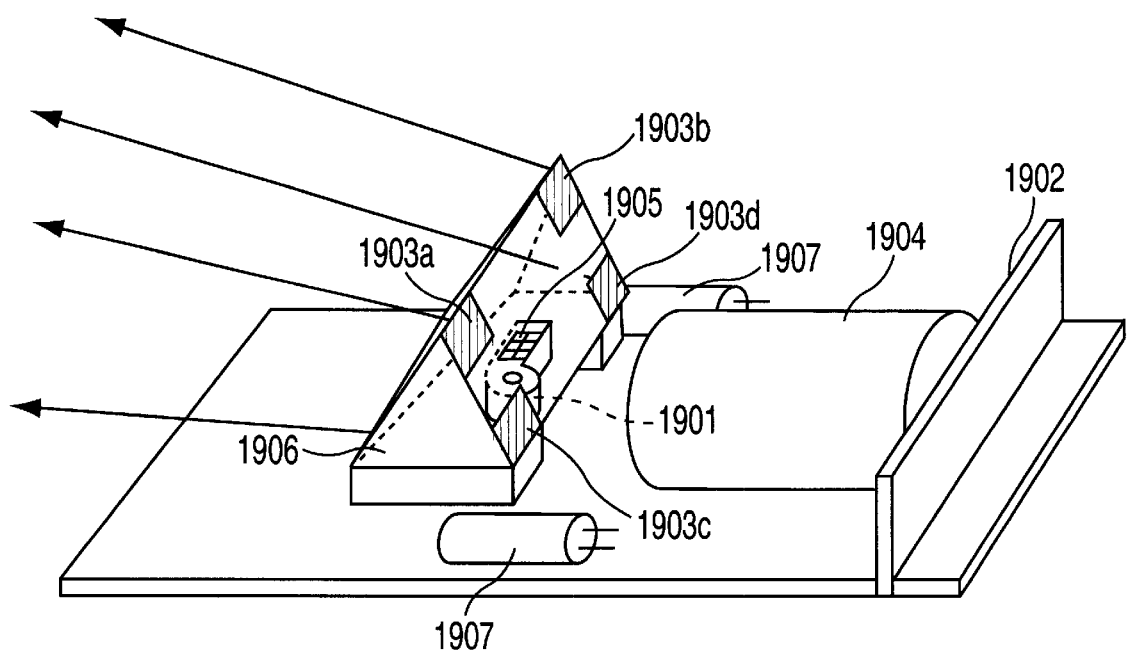
FIG. 19 is a perspective view of a fourth embodiment of a frame locator for the present invention.

The fourth variation, illustrated in FIG. 19, combines diffractive or binary optics 1905 with a mirror combination 1903a–d to create four spots for identifying the corners of the target area. The laser diode 1901 is expanded by optics 1905 (illustrated here as crossed diffraction gratings) at an angle of ±13.3 degrees, to match the corners of the field of view. The mirrors 1903a–d are disposed on a plane of a transparent base mounting 1906 which allows reflected ambient and/or illuminating light to be transmitted through the base to the focussing optics 1904 and the detector 1902 with no or minimal loss. The plane on which the mirrors are mounted is angled so as to direct the diverging beamlets along a path centered along the optical path. The optical coatings by which the mirrors 1903a–d are formed can be selected to optimize reflection of the laser beam's wavelength, as is known in the art. In this variation, illumination for reading the scanned image may be provided by infrared LEDs 1907 mounted on either side of the frame locator assembly, so that the light from the frame locator can be readily filtered from the signal received by the detector by the appropriate bandpass filter. In the above variations, infrared LEDs may also be used in combination with the visible laser light of the frame locator. By using IR, the illumination is invisible to the user, so that it is no difficulty in matching the field of view exactly, as long as the entire field of view is covered by the frame locator.

For each of the above variations in which the laser beam is divided into diverging beamlets, the binary optics and/or diffraction gratings are conventional optical devices which are known in the art. All that is required is the transformation of a single collimated beam into a plurality of, and preferably four, collimated beams that are diverging from the optical axis at an angle to match the expansion of the field of view at increasing distance from the device. A diffraction grating is ideally suited for this application since the first order beams should be of sufficient intensity to provide a pair of spots diverging in opposite directions. To provide four spots, two diffraction gratings can be overlaid at 90° to each other, using the first order beams generated by each grating. In order to align the spots with the corners of the field, the grating assembly should be rotated 45° with respect to the rows and columns of the detector array.

Figure 12:
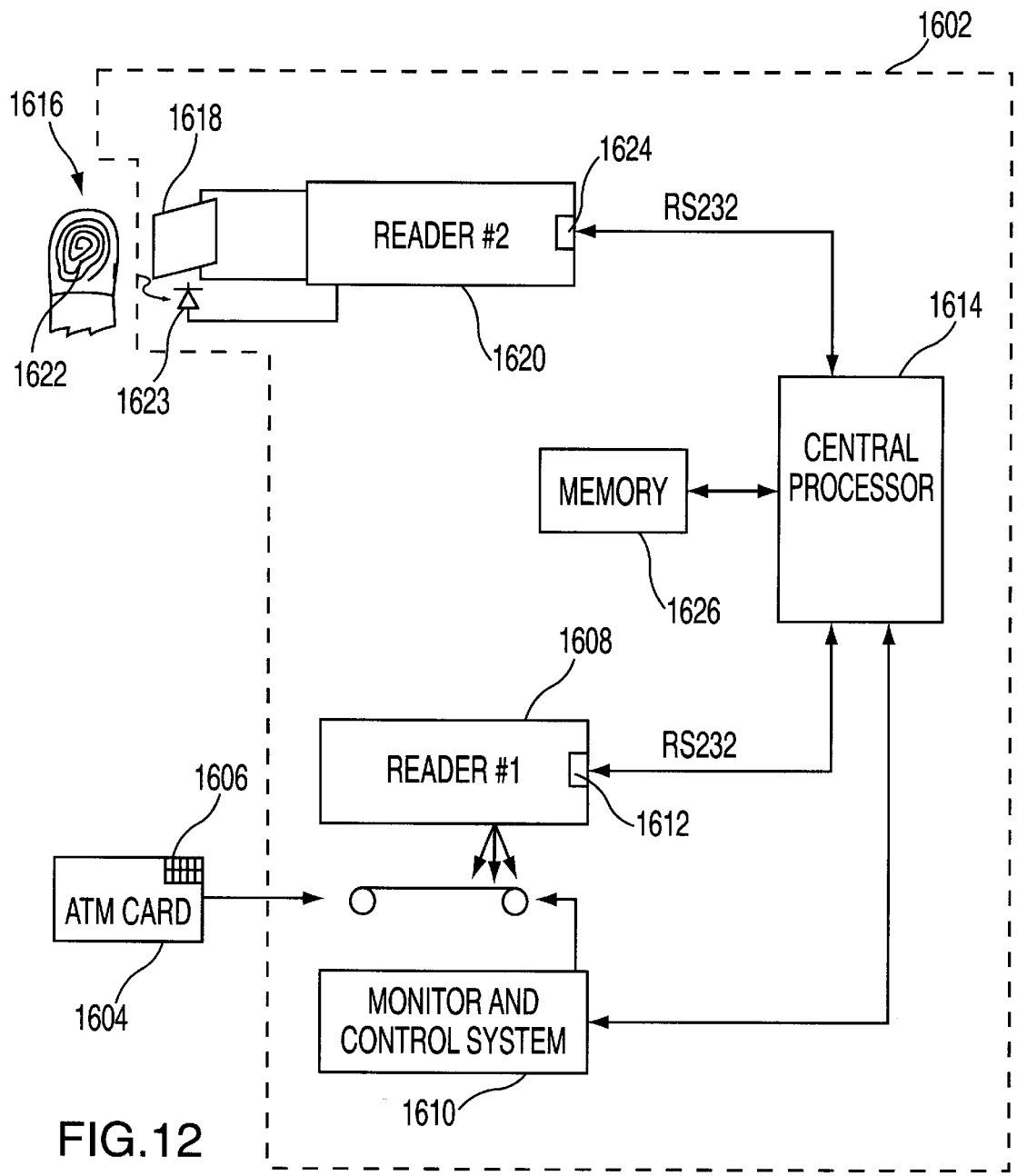
FIG. 12 is a block diagram of an application of the present invention, in which either embodiment of the optical scanning head of the present invention can be used to verify and compare two-dimensional images.

With reference to FIG. 12, an application will be described in which the present invention may be used to read, verify and compare two-dimensional images. In this application, a banking institution uses the optical scanner of the present invention to identify a person using the banking facilities as an authorized customer. For example, when a person opens an account with the bank, he or she may elect to receive access to the bank's automatic teller machines (ATMs) 1602. The bank will then issue the person an ATM card 1604 for accessing ATMs 1602. It is necessary, each time the person uses an ATM 1602, to verify that the person using the ATM card 1604 is the same person that was issued the ATM card 1604.

One way to ensure that the person using the ATM card 1604 is actually the person that holds the bank account is to use fingerprint comparison between the user and the account holder. To do this, when the account holder opens the account, the bank may read his or her fingerprint using the optical scanner 100 of the present invention, store the data representative of the fingerprint, and encode the stored data into some symbolic form, such as a one- or two-dimensional barcode symbol 1606. The encoded barcode symbol 1606 can then be placed on the ATM card 1604, as shown in FIG. 12, for later use.

The coded ATM card 1604 can then be used for verification when the card user attempts to access an ATM 1602. Before being given access to the account holder's bank account, the ATM 1602 will ask the user to insert the ATM card 1604 into the ATM 1602. The user then inserts the ATM card 1604 into the ATM 1602, which is equipped with a first reader 1608 in accordance with the optical scanner 100 of the present invention, as well as an existing monitor and control system 1610. The card inserted by the user is not limited to an ATM card, but rather may be a credit card, etc. The monitoring and control system reads the account number and other pertinent information from the ATM card 1604, while the first reader 1608 captures the encoded barcode symbol 1606 from the ATM card 1604 and decodes it into the stored data representative of the fingerprint encoded in the barcode symbol 1606. This stored data is then sent through an RS232 interface 1612 to a central processor 1614. Alternatively, the conversion may take place in the central processor 1614.

The ATM 1602 then asks the card user to place his or her fingertip 1616 against a sensitive surface 1618, such as coated glass, that is electronically controlled to provide the proper contrast for the two-dimensional image (e.g., the fingertip 1616). Such sensitive surfaces or coated glass 1618 are well known to those skilled in the art. A photodiode 1623, or other type of photodetector, may be placed within, as described above, or in the vicinity of the reader, as shown here, to measure the amount of light reflected from the fingertip 1616 to determine the reader's exposure time for this particular image and to control the amount of additional illumination, if any, that should be emitted by the reader's light sources to ensure a clear image of the target. A second reader 1620 (also in accordance with the optical scanner 100 of the present invention) captures the fingerprint 1622 from the fingertip 1616, compresses the captured fingerprint image, and converts it to image data representative of the fingerprint 1622. This image data is then sent over another RS232 interface 1624 to the central processor 1614.

The central processor 1614 compares the image data read by the second reader 1620 to the stored data read by the first reader 1608. If the image data matches the stored data, the central processor 1614 verifies that the user is the same person as the account holder and gives the user access to the account. If, on the other hand, the image data and stored data do not match, indicating the user and the account holder are not the same person, the user is denied access to the account.

Accordingly, the optical scanner 100 of the present invention is a valuable tool in personal identification and verification of identity for various systems, including security, immigration, health care, industrial, and others. The optical scanner 100 can be used in a variety of applications, including reading two-dimensional images encoded on identification cards (e.g., passports, drivers licenses, ATM cards, etc.), as well as other two-dimensional images, such as fingerprints, photographs, and barcode symbols. In these applications two optical scanners 100 need not be provided;

only one is necessary where the stored data is maintained in a memory 1526 that can be accessed by the processor 1514, or where the optical scanner 100 reads a first image, stores that image data, and then reads a second image. In contrast, additional optical scanners 100 can be provided where several means of identification or several images must be read.

The circuitry of the optical scanner 100 may be protected within a housing that is contoured to easily fit into a person's hand. The optical scanner 100 is gripped at a handle portion, with the window portion 204 of the optical scanner 100 aimed at the two-dimensional image to be read. A trigger may be built into the handle for easy, one-handed operation of the optical scanner 100, with the trigger being positioned at a short distance from the user's fingers so that activation is simply a matter of depressing the trigger. A dual trigger, multi-position trigger, or additional switch may be provided for selecting between one-dimensional and two-dimensional scanning, so that only as much power is used as is necessary to assure a high quality signal. The window portion 204 can be placed anywhere from 0 to 18 inches above or in front of the image to be scanned. With a scanning distance of less than seven inches, it is desirable to center the fan of light over the image. This is because different light intensities, due to the sequential limitation of the LEDs and the higher density of light at the center of the fan, may illuminate some portions of the image more brightly than others. For scans greater than 182 inches, the LEDs can be replaced with a flash lamp or a more intense light source.

The optical scanner 100 of the present invention provides a device for building a small or self-contained portable device, a portable component of a multi-component scanner, or the optical portion of a built-in scanning unit, for two-dimensional image scanning using LED and CMOS or LED and CCD technology. In either implementation, CMOS or CCD, the present invention is an economical device. But, by combining a CMOS decoder with the LED array in accordance with the present invention, the optical scanner 100 is made extremely inexpensive and cost-effective. The optical scanner 100 is capable of reading bar codes up to 18 inches away from the detector with LED illumination and even more with a flash lamp, so that it is versatile for either portable or fixed implementation. The variably pulsed activation of the LEDs and CMOS or CCD array, or the graduated illumination of the LEDs, makes the device capable of operating at low power with minimal power drain during illumination, a significant factor in portable scanners. The lens system and fan of incoherent light produced by the LED array permit the reading of wide range of images.

For point-of-sale use, or industrial applications, where the scanner is fixed and the object imprinted with the two-dimensional image is moved past it, a single scanner may be used, or a number of optical scanners 100 of the present invention can be used in combination and mounted at different angles so that, regardless of the orientation or position of the image, it can be read. For example, a crossed or starburst pattern can be made by combining two or four optical scanners 100, respectively. The signal generated by each individual optical scanner 100 will be compared with signals from the other optical scanners 100, and the signal with the least error will be used. The signals from each optical scanner 100 may also be used to double check the signals provided by other optical scanners 100.

It is important to note that certain embodiments of this invention, an optimization of useful illumination from the LEDs is accomplished by a combination of focusing and diffusing the light to shape the beam to cover the field of view of the lens system. In the case of one-dimensional barcodes, it is a uniform linewidth of an extent that matches or overlaps the length of the barcode. In the case of two-dimensional codes and images such as signatures or fingerprints, it is a uniform circle or rectangle circumscribing the extent of the code in height and width.

It will be apparent to those skilled in the art that various modifications and variations can be made in the apparatus and method of the present invention without departing form the spirit or scope of the invention. Thus, it is intended that the present invention cover the modifications and variations of this invention, provided they come within the scope of the appended claims and their equivalents.

What is claimed is:

1. An optical scanning device for reading a two-dimensional image having a first width wherein an ambient light impinges upon said two-dimensional image, said optical scanning device comprising:

a printed circuit board having a front edge with a second width;

a light source mounted on said printed circuit board, said light source for projecting an emitted beam of light onto said two-dimensional image, said emitted beam of light having substantially said second width at said front edge of said printed circuit board and a first height and a third width at said two-dimensional image, said third width being greater than said second width and at least as large as said first width;

a framing means disposed on said printed circuit board for framing said two-dimensional image to identify an area to be scanned by said sensor, wherein said framing means comprises at least one laser diode for emitting a laser beam and at least one diffractive optic for transforming said laser beam into a plurality of diverging beamlets, said diverging beamlets having a beam edge and a beamlet spacing at said two-dimensional image at least as large as said first width;

an optical assembly disposed on said printed circuit board along an optical path for focussing light reflected from said framed two-dimensional image to obtain a focussed light, said reflected light comprising at least one of said ambient light and said emitted beam of light;

a detector disposed on said printed circuit board along said optical path behind said optical assembly for detecting at least a portion of said focussed light within a field of view of said detector, said field of view having said first height and said third width, said detector for sensing said focussed light to obtain a sensed two-dimensional image;

a controller for generating a plurality of control signals for controlling activation of said light source and said detector;

a processor for processing said sensed two-dimensional image to obtain an electrical image signal; and an output means for converting said electrical image signal into image data.

2. The optical scanning device recited in claim 1 further comprising a photodetector for determining a level of light received at said detector and providing an input signal to said controller, wherein said controller causes said light source to be activated when said level of light is lower than needed to obtain said sensed two-dimensional image.

3. The optical scanning device recited in claim 1 wherein said diffractive optic comprises at least one diffraction grating for transforming said laser beam into at least two diverging beamlets for defining at least two spots along an edge of said field of view.

4. The optical scanning device recited in claim 3 wherein said at least one diffraction grating comprises two diffraction gratings disposed at 90 degrees to each other so that four diverging beamlets are formed for defining four spots along said beam edge.

5. The optical scanning device recited in claim 4 wherein said beam is square and each of said four spots is disposed at a corner of the square beam.

6. The optical scanning device recited in claim 1 wherein said diffractive optic includes a mirror assembly comprising a plurality of discrete reflective surfaces for reflecting said at least two diverging beamlets so that they diverge along a beam path centered along said optical path.

7. The optical scanning device as recited in claim 6 wherein said mirror assembly further comprises a base on which said plurality of discrete reflective surfaces are formed, said base being transparent to said ambient light and said light source.

8. The optical scanning device recited in claim 1 wherein said diffractive optic comprises a binary optic for transforming said laser beam into at least two diverging beamlets for defining at least two spots along said beam edge.

9. The optical scanning device recited in claim 1 wherein said light source comprises an array of LEDs.

10. The optical scanning device recited in claim 9 wherein each LED of said array is an infrared LED.

11. The optical scanning device recited in claim 1 further comprising a beam splitter disposed within said optical path for aligning said diverging beamlets along said optical path.

12. A frame locator for an optical scanner having a light source and a detector with a field of view for locating a target image within the field of view of the optical scanner, said detector for detecting an ambient light and an illuminating light from said light source, the frame locator comprising:
    at least one laser diode disposed within the optical scanner for emitting a laser beam; and
    a diffractive optic for transforming said laser beam into a plurality of diverging beamlet, said diverging beamlets defining a beam edge and a beam width at said target image substantially equal to a width of the field of view.

13. The frame locator recited in claim 12 wherein said diffractive optic comprises at least one diffraction grating for transforming said laser beam into at least two diverging beamlets for defining at least two spots along said beam edge.

14. The frame locator recited in claim 13 wherein said at least one diffraction grating comprises two diffraction gratings disposed at 90 degrees to each other so that four diverging beamlets are formed for defining four spots along said beam edge.

15. The frame locator recited in claim 14 wherein said beam is square and each of said four spots is disposed at a corner of the square beam.

16. The frame locator recited in claim 12 wherein said diffracting optic includes a mirror assembly comprising a plurality of discrete reflective surfaces for reflecting said at least two diverging beamlets so that they diverge along a beam path centered along said optical path.

17. The frame locator as recited in claim 16 wherein said mirror assembly further comprises a base on which said plurality of discrete reflective surfaces are formed, said base being transparent to said ambient light and said illuminating source.

18. The frame locator recited in claim 17 wherein said diffracting optic comprises a binary optic for transforming said laser beam into at least two diverging beamlets for defining at least two spots along said beam edge.

19. An optical scanning device for reading a two-dimensional image having a first width wherein an ambient light impinges upon said two-dimensional image, said optical scanning device comprising:
    a sensor for capturing said two-dimensional image, said sensor including:
        a printed circuit board having a front edge with a second width;
        a light source mounted on said printed circuit board, said light source for projecting an emitted beam of light onto said two-dimensional image, said emitted beam of light having substantially said second width at said front edge of said printed circuit board and a first height and a third width at said two-dimensional image, said third width being greater than said second width and at least as large as said first width;
        a framing means disposed on said printed circuit board for framing said two-dimensional image to identify an area to be scanned by said sensor, wherein said framing means comprises at least one laser diode for emitting a laser beam and at least one diffractive optic for transforming said laser beam into a plurality of diverging beamlets, said diverging beamlets having a beam edge and a beamlet spacing at said two-dimensional image at least as large as said first width;
        an optical assembly disposed on said printed circuit board along an optical path for focussing light reflected from said framed two-dimensional image to obtain a focussed light, said reflected light comprising at least one of said ambient light and said emitted beam of light;
        a detector disposed on said printed circuit board along said optical path behind said optical assembly for detecting at least a portion of said focussed light within a field of view of said detector, said field of view having said first height and said third width, said detector for sensing said focussed light to obtain a sensed two-dimensional image;
        a controller for generating a plurality of control signals for controlling activation of said light source and said detector;
        a processor for processing said sensed two-dimensional image to obtain an electrical image signal;
    a compressor for compressing said electrical image signal, said compressor employing a compression algorithm to obtain a compressed image signal; and
    a decoder for decoding said compressed image signal to obtain image data representative of said two-dimensional image.

20. The optical scanning device recited in claim 19 wherein said diffractive optic comprises two diffraction gratings disposed at 90 degrees to each other so that four said diverging beamlets are formed for defining four spots along said beam edge.

* * * * *